United States Patent
Lai et al.

(10) Patent No.: US 12,237,230 B2
(45) Date of Patent: Feb. 25, 2025

(54) SEMICONDUCTOR DEVICE WITH LEAKAGE CURRENT SUPPRESSION AND METHOD FOR FORMING THE SAME

(71) Applicant: Taiwan Semiconductor Manufacturing Company, Ltd., Hsin-Chu (TW)

(72) Inventors: Bo-Yu Lai, Taipei (TW); Jyun-Chih Lin, Hsinchu (TW); Yen-Ting Chen, Taichung (TW); Wei-Yang Lee, Taipei (TW); Chia-Pin Lin, Hsinchu County (TW); Wei Hao Lu, Taoyuan (TW); Li-Li Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 314 days.

(21) Appl. No.: 17/238,778

(22) Filed: Apr. 23, 2021

(65) Prior Publication Data

US 2022/0122893 A1  Apr. 21, 2022

Related U.S. Application Data

(60) Provisional application No. 63/093,531, filed on Oct. 19, 2020.

(51) Int. Cl.
*H01L 21/8238* (2006.01)
*H01L 21/764* (2006.01)
(Continued)

(52) U.S. Cl.
CPC .... *H01L 21/823814* (2013.01); *H01L 21/764* (2013.01); *H01L 29/42392* (2013.01);
(Continued)

(58) Field of Classification Search
CPC ........... H01L 29/0673; H01L 29/42392; H01L 29/66787
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| CN | 108695378 A | 10/2018 |
| CN | 109273362 A | 1/2019 |

(Continued)

OTHER PUBLICATIONS

Semiconductor Lithography. (n.d.). https://www.newport.com/n/photolithography-overview (Year: 2020).*

*Primary Examiner* — Steven M Christopher
*Assistant Examiner* — Cole Leon Lindsey
(74) *Attorney, Agent, or Firm* — HAYNES AND BOONE, LLP

(57) ABSTRACT

A method of manufacturing a semiconductor device includes forming a fin structure over a substrate, forming a sacrificial gate structure over the fin structure, and etching a source/drain (S/D) region of the fin structure to form an S/D recess. The fin structure includes first semiconductor layers and second semiconductor layers alternately stacked. The method further includes depositing an insulating dielectric layer in the S/D recess, depositing an etch protection layer over a bottom portion of the insulating dielectric layer, and partially removing the insulating dielectric layer. The method further includes growing an epitaxial S/D feature in the S/D recess. The bottom portion of the insulating dielectric layer interposes the epitaxial S/D feature and the substrate.

20 Claims, 26 Drawing Sheets

(51) Int. Cl.
*H01L 29/423* (2006.01)
*H01L 29/66* (2006.01)
*H01L 29/786* (2006.01)

(52) U.S. Cl.
CPC .... *H01L 29/6653* (2013.01); *H01L 29/66545* (2013.01); *H01L 29/78696* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | LiaW |
| 9,520,482 B1 | 12/2016 | Chang et al. |
| 9,576,814 B2 | 2/2017 | Wu et al. |
| 10,170,638 B1 | 1/2019 | Reznicek |
| 2018/0301564 A1* | 10/2018 | Kwon ................. H01L 29/0653 |
| 2019/0164842 A1* | 5/2019 | Lee ..................... H01L 27/0886 |
| 2020/0044060 A1 | 2/2020 | Cheng et al. |

FOREIGN PATENT DOCUMENTS

| | | |
|---|---|---|
| CN | 109427588 A | 3/2019 |
| CN | 109755290 A | 5/2019 |
| CN | 109860050 A | 6/2019 |
| CN | 110867445 A | 3/2020 |
| KR | 20180115392 A | 10/2018 |

\* cited by examiner

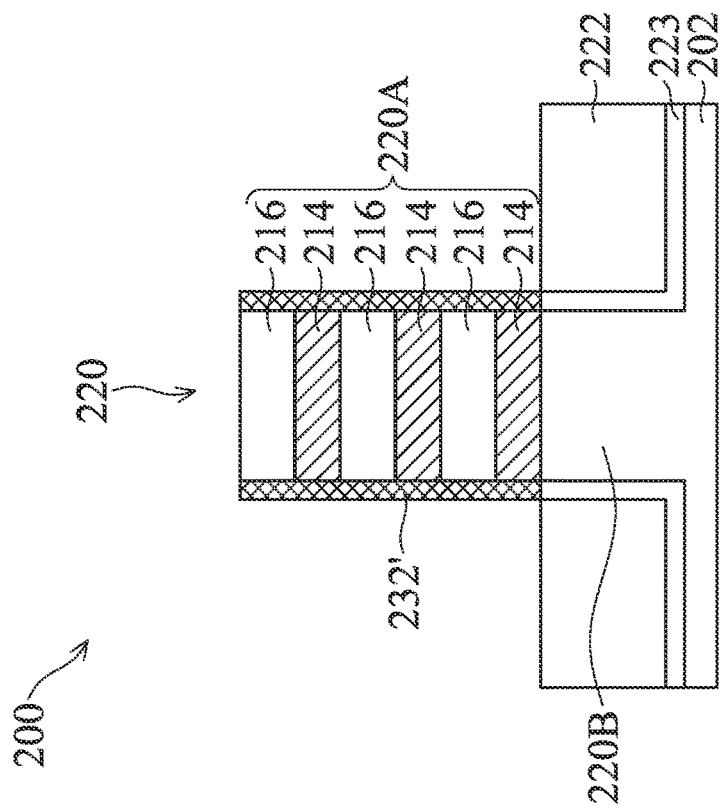
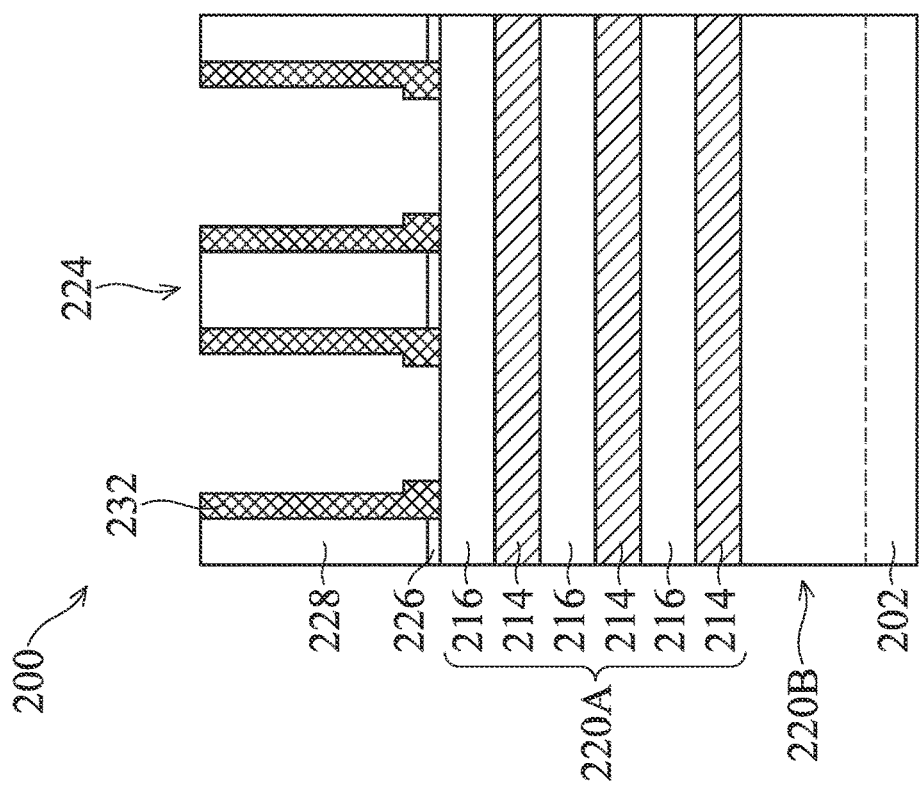
B-B
FIG. 10B
A-A
FIG. 10A

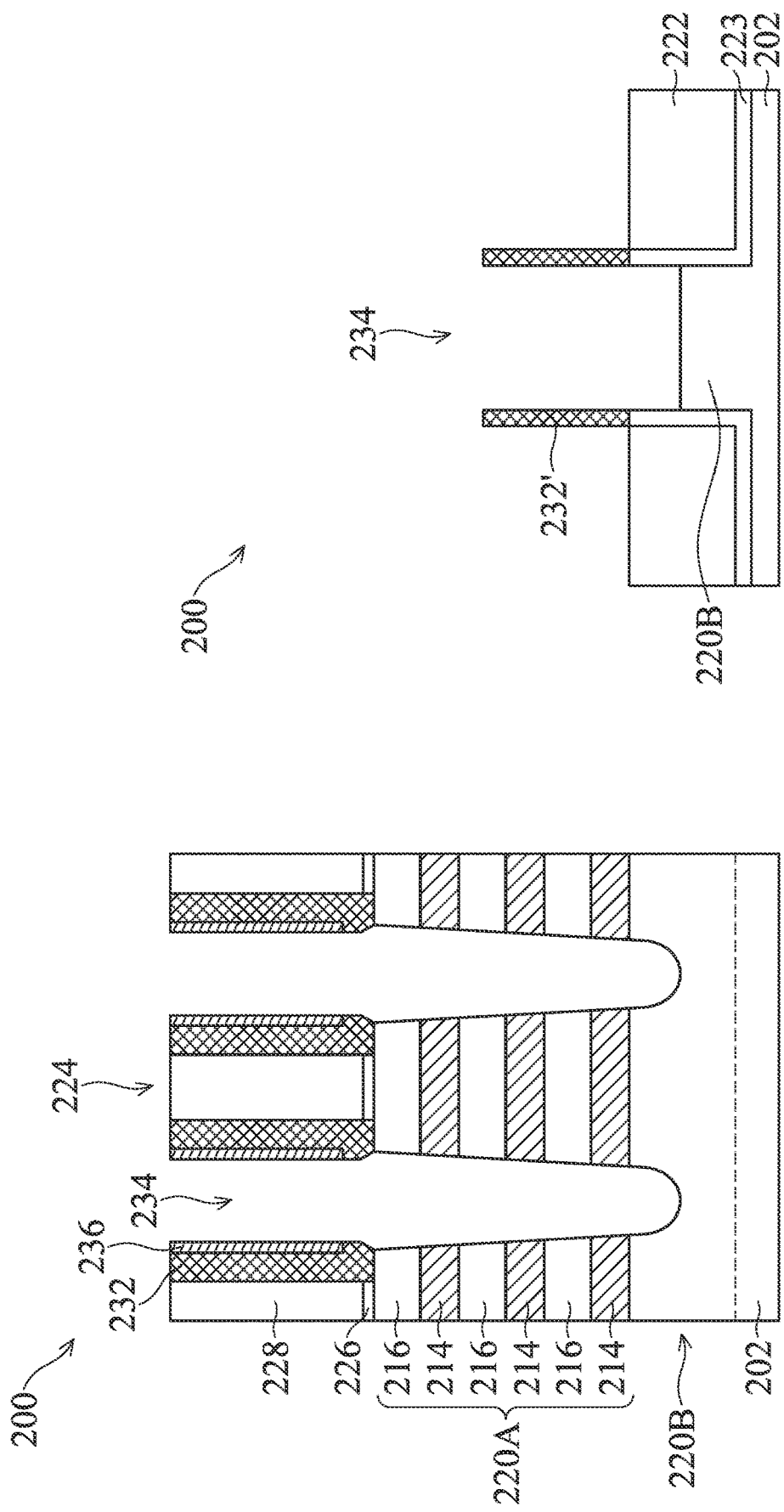

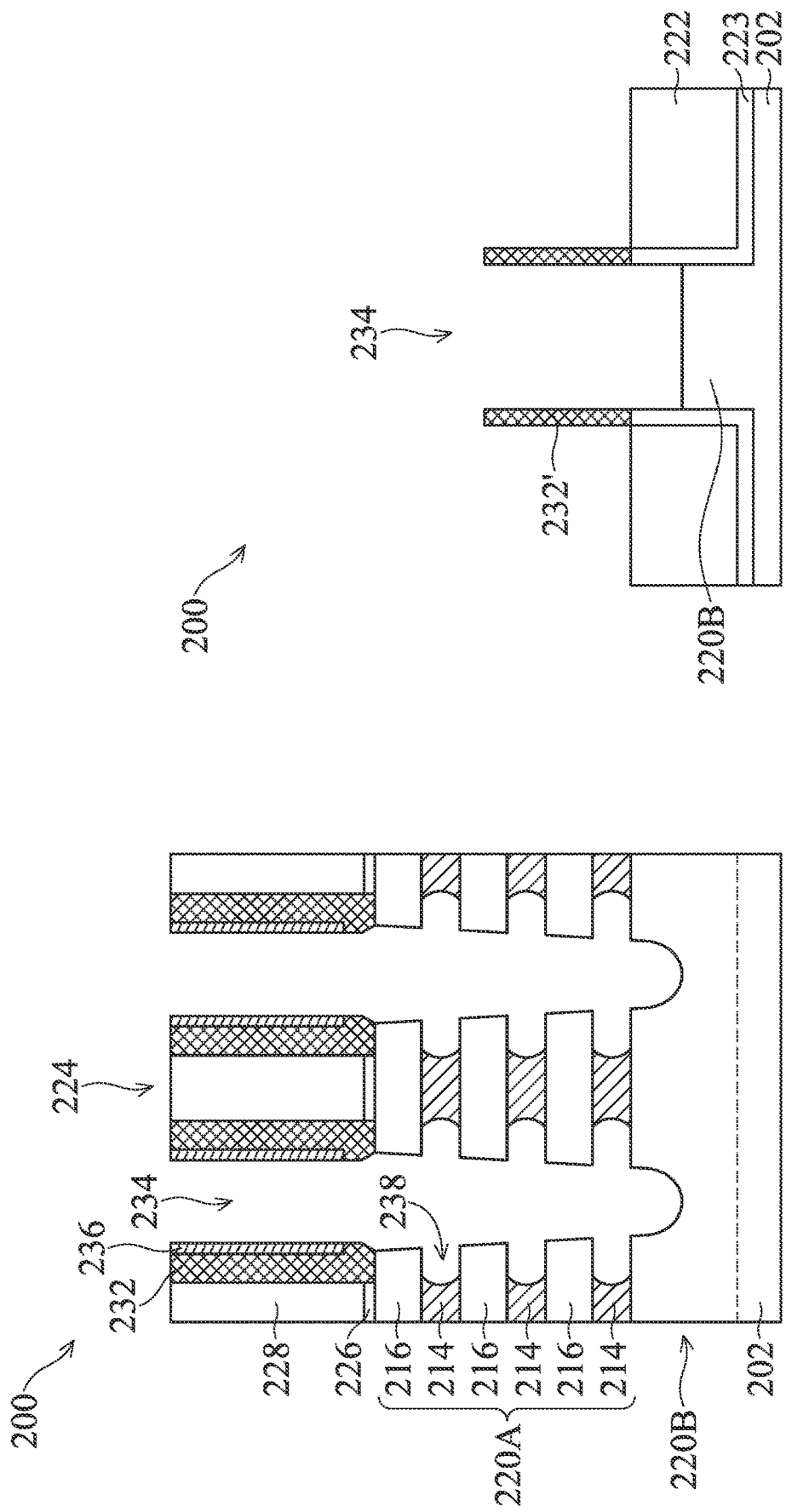
FIG. 12A  A-A
FIG. 12B  B-B

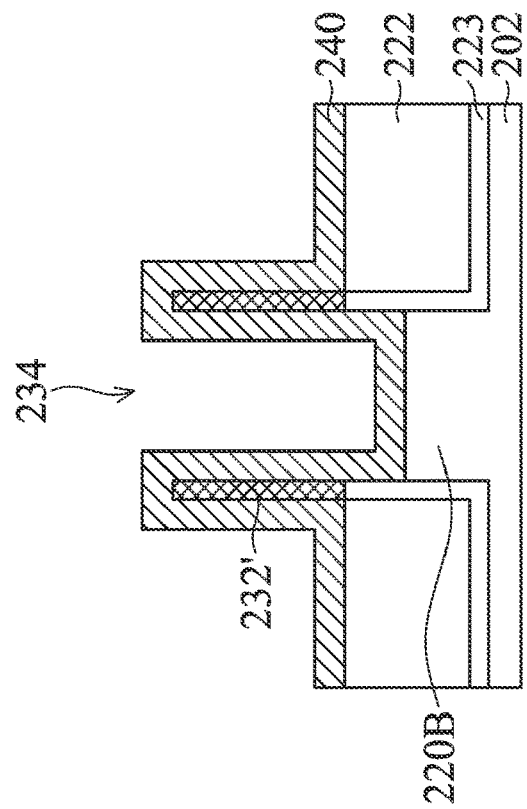
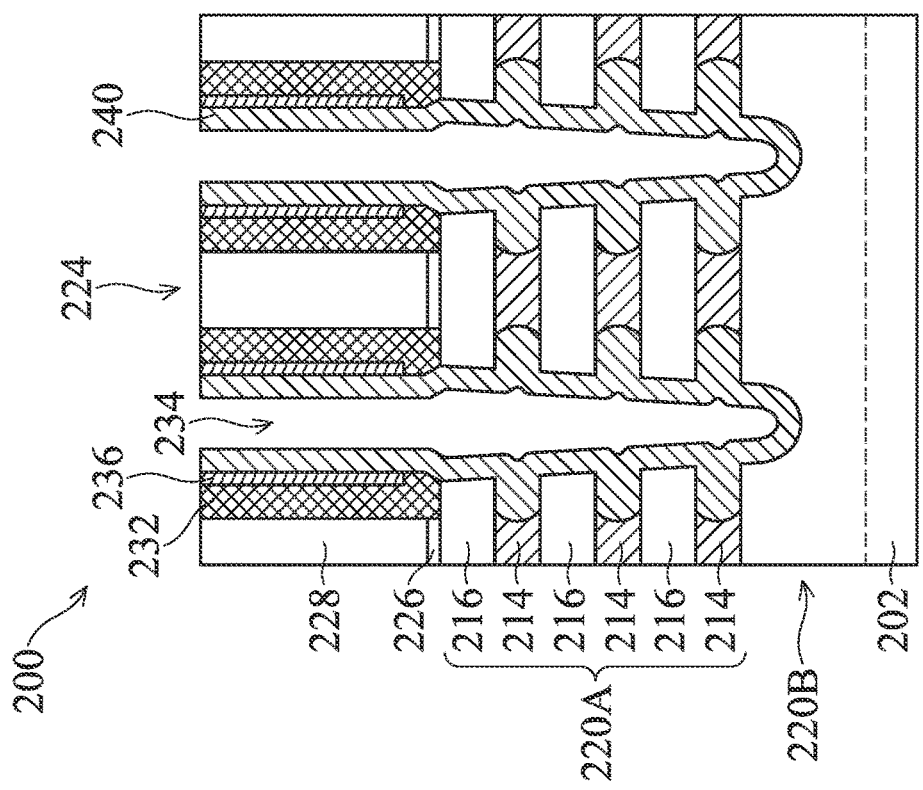
FIG. 13A
FIG. 13B

B-B

A-A

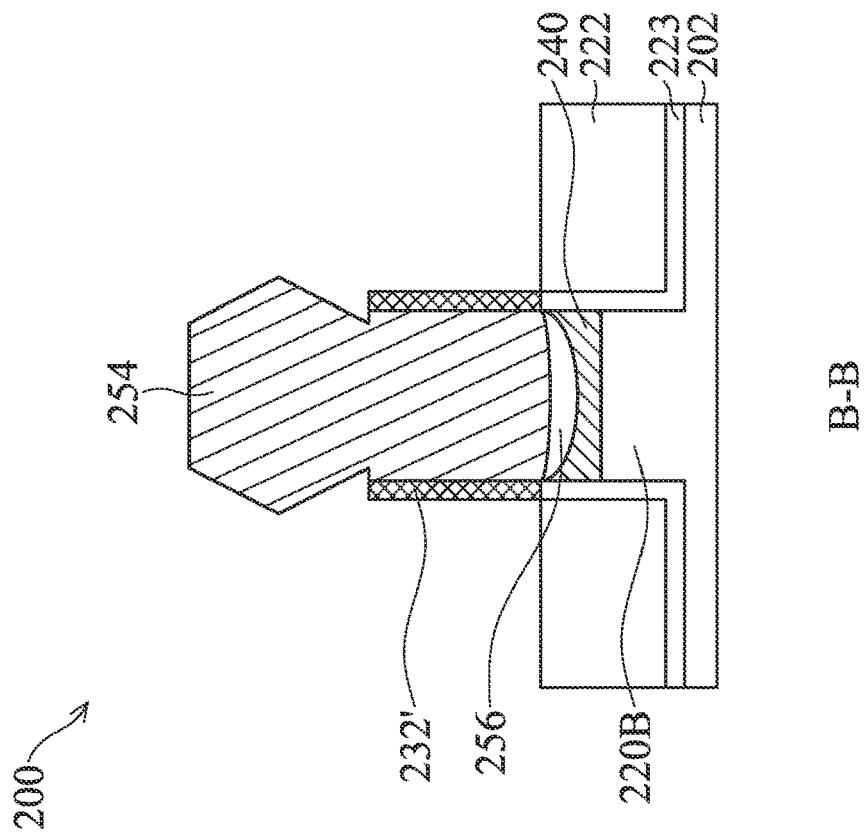
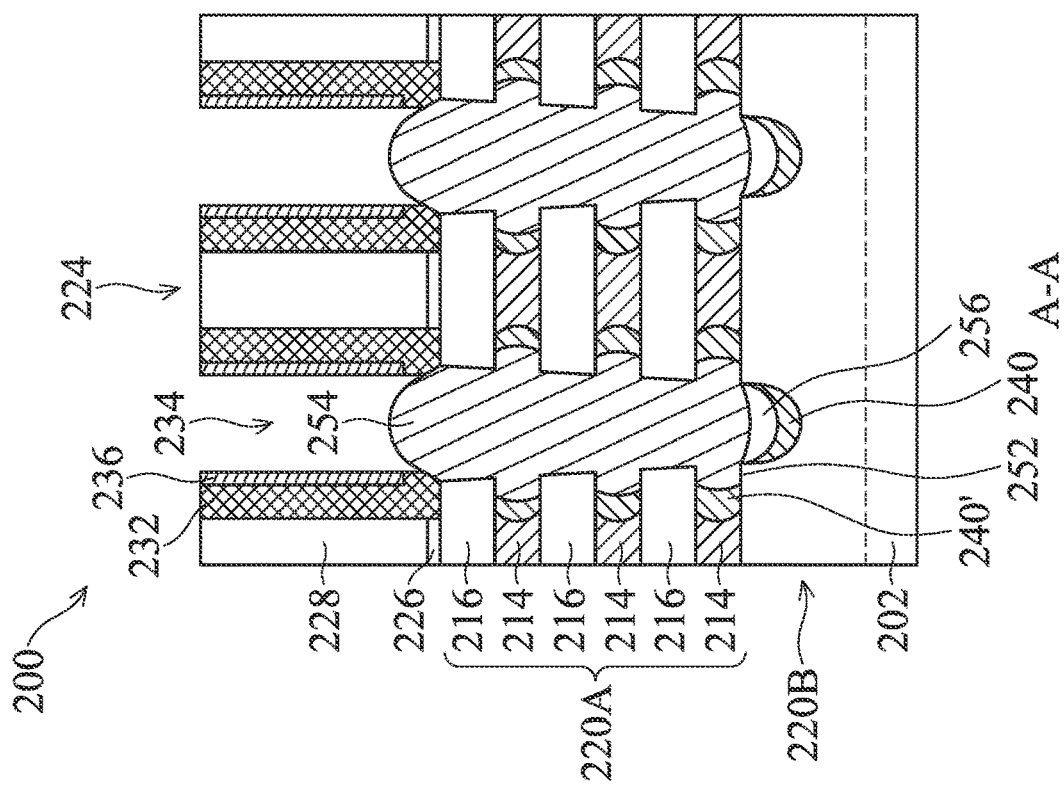
FIG. 16A  
FIG. 16B

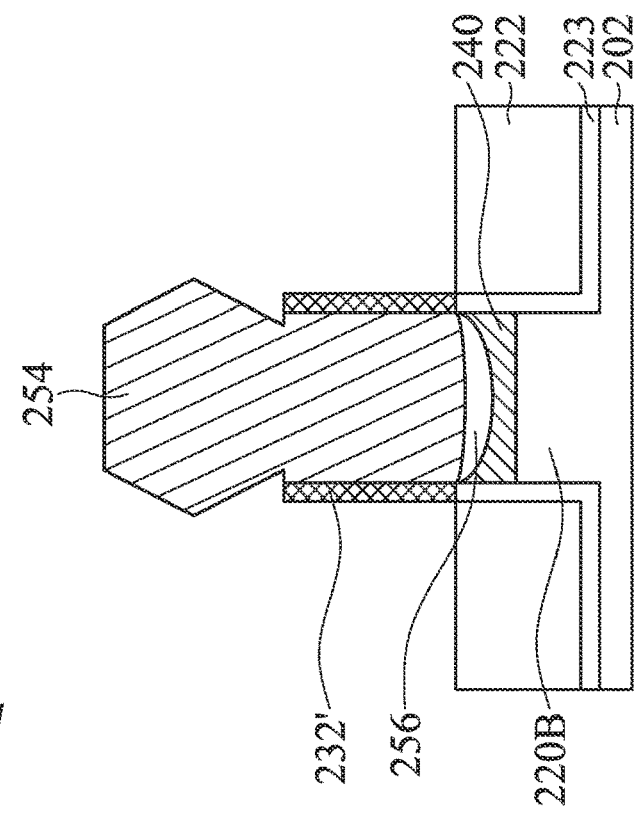
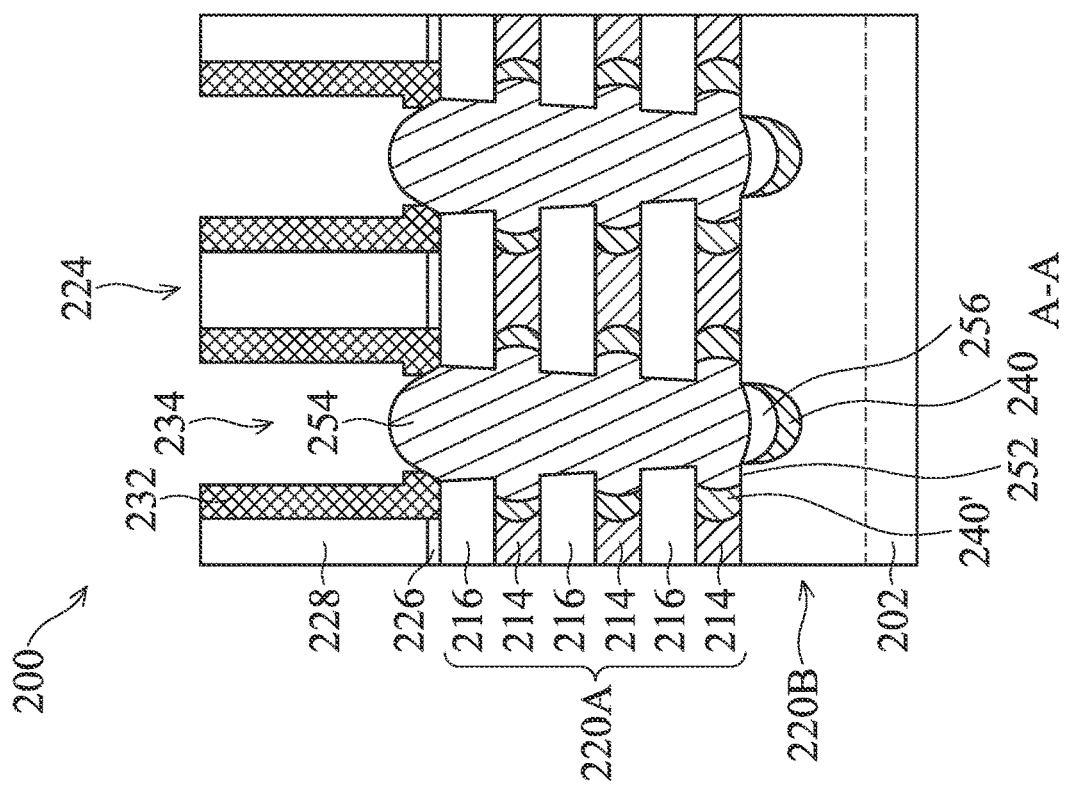
FIG. 17A
FIG. 17B

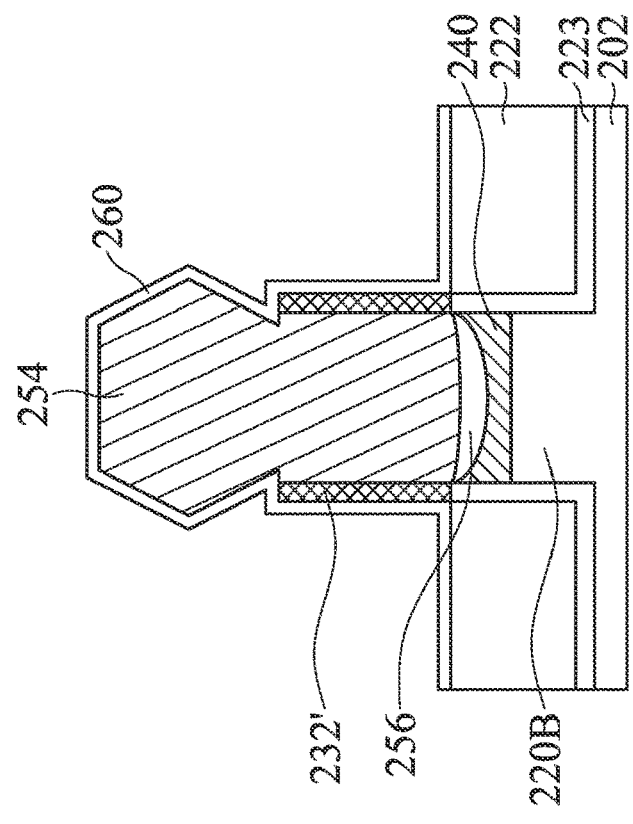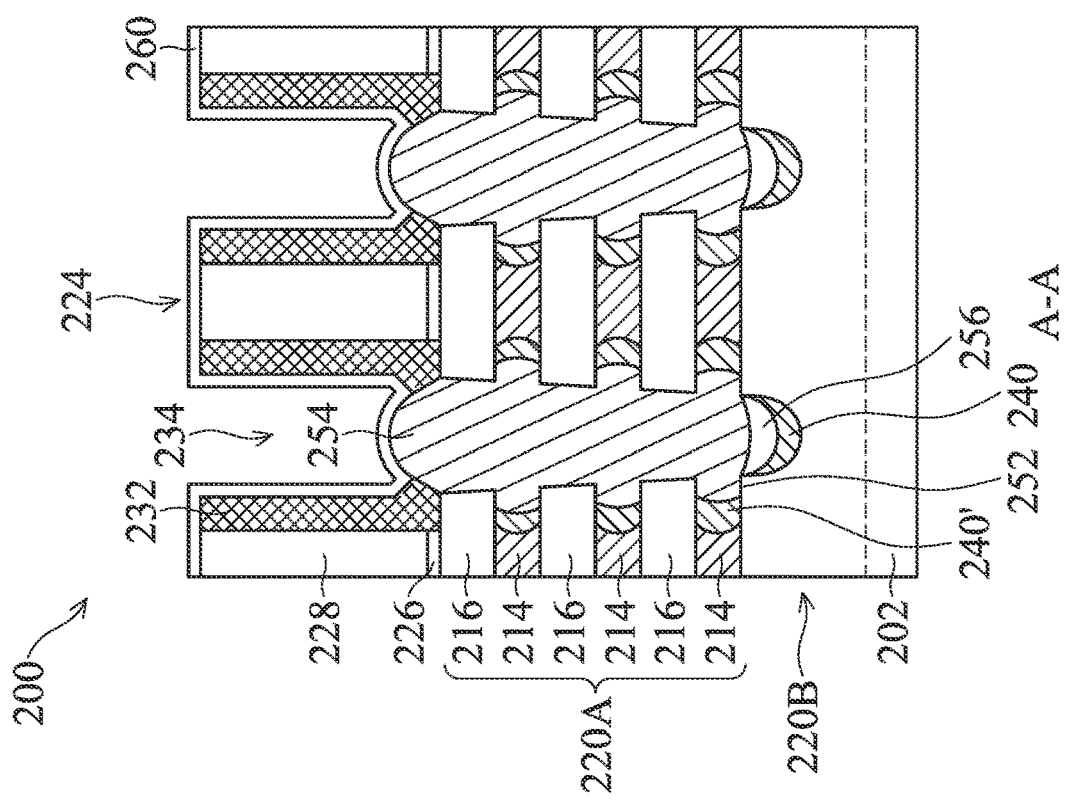
FIG. 18A
FIG. 18B

B-B

A-A

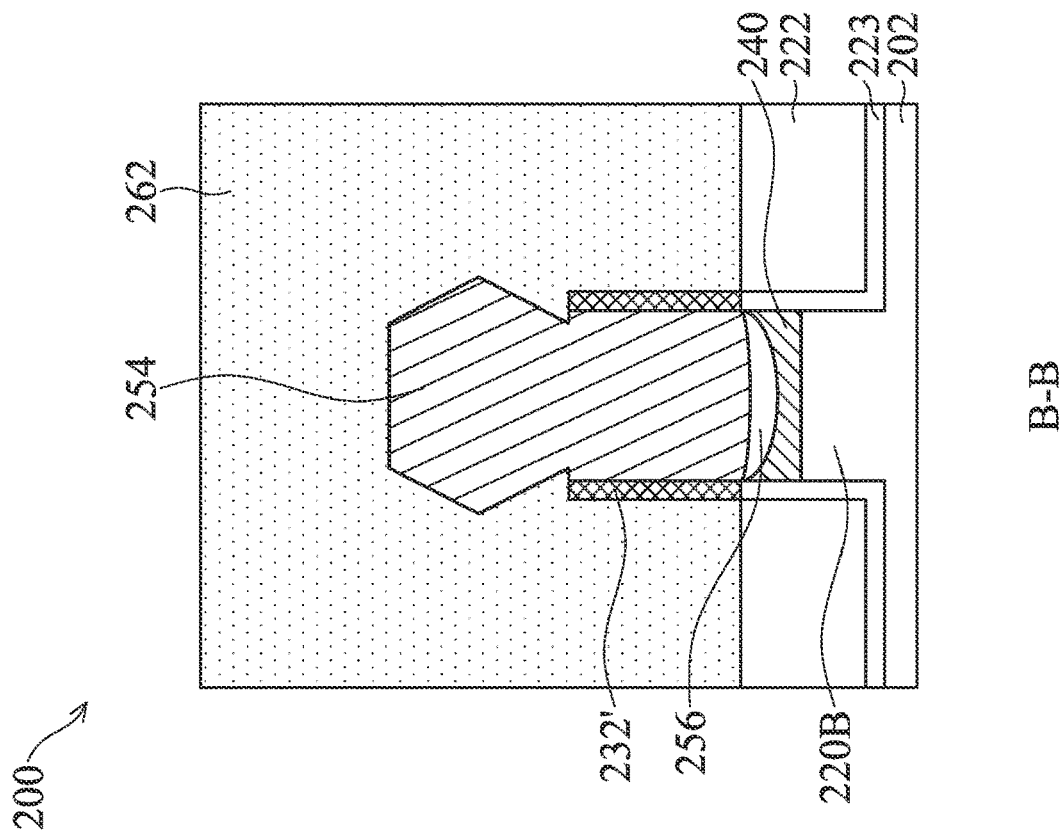
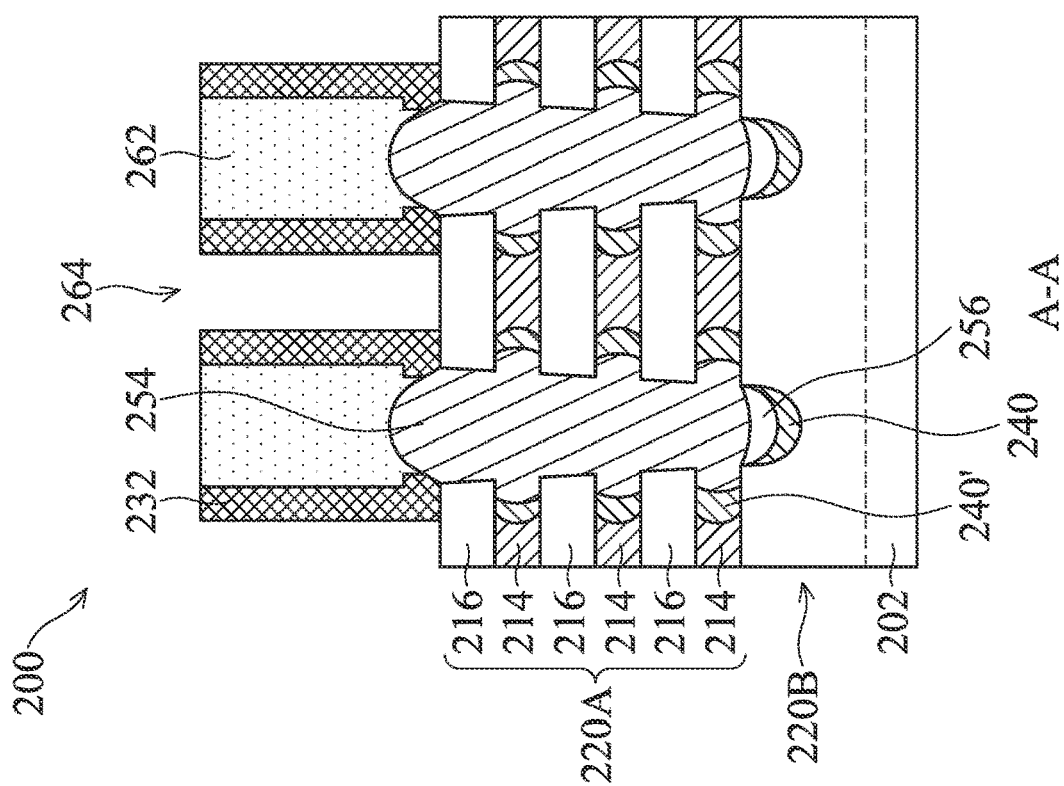

B-B

A-A

B-B

A-A

B-B

A-A

SEMICONDUCTOR DEVICE WITH LEAKAGE CURRENT SUPPRESSION AND METHOD FOR FORMING THE SAME

PRIORITY DATA

This application claims priority to U.S. Provisional Patent Application No. 63/093,531 filed on Oct. 19, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate transistors have been introduced in an effort to improve gate control by increasing gate channel coupling, reduce OFF-state current, and reduce short-channel effects (SCEs). One such multi-gate transistor is the gate-all-around (GAA) transistor. In some examples, a gate structure of a GAA transistor wraps around a channel region providing access to the channel on multiple sides. GAA transistors are compatible with complementary metal-oxide-semiconductor (CMOS) processes and their structure allows them to be aggressively scaled while maintaining gate control and mitigating SCEs. The channel region of an GAA transistor is formed from stacked channel structures, such as nanowires, nanosheets, other nanostructures, and/or other appreciable variations. As the semiconductor industry further progresses into sub-10 nanometer (nm) technology process nodes in pursuit of higher device density, higher performance, and lower costs, integration of fabricating the GAA features around stacked nanosheets can be challenging. For example, conventionally in a GAA process flow, a gate structure extending around the bottommost channel structure also engages a top surface of the semiconductor substrate thereunder, causing strong leakage current under the stacked channel structures. Therefore, while the current methods have been satisfactory in many respects, challenges with respect to performance of the resulting device may not be satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, and 25B are corresponding fragmentary cross-sectional views of a semiconductor device in FIG. 9 taken along a A-A cut and a B-B cut, respectively, at intermediate stages of an embodiment of the method of FIGS. 1A and 1B in accordance with some embodiments.

DETAILED DESCRIPTION

Figure 1A:
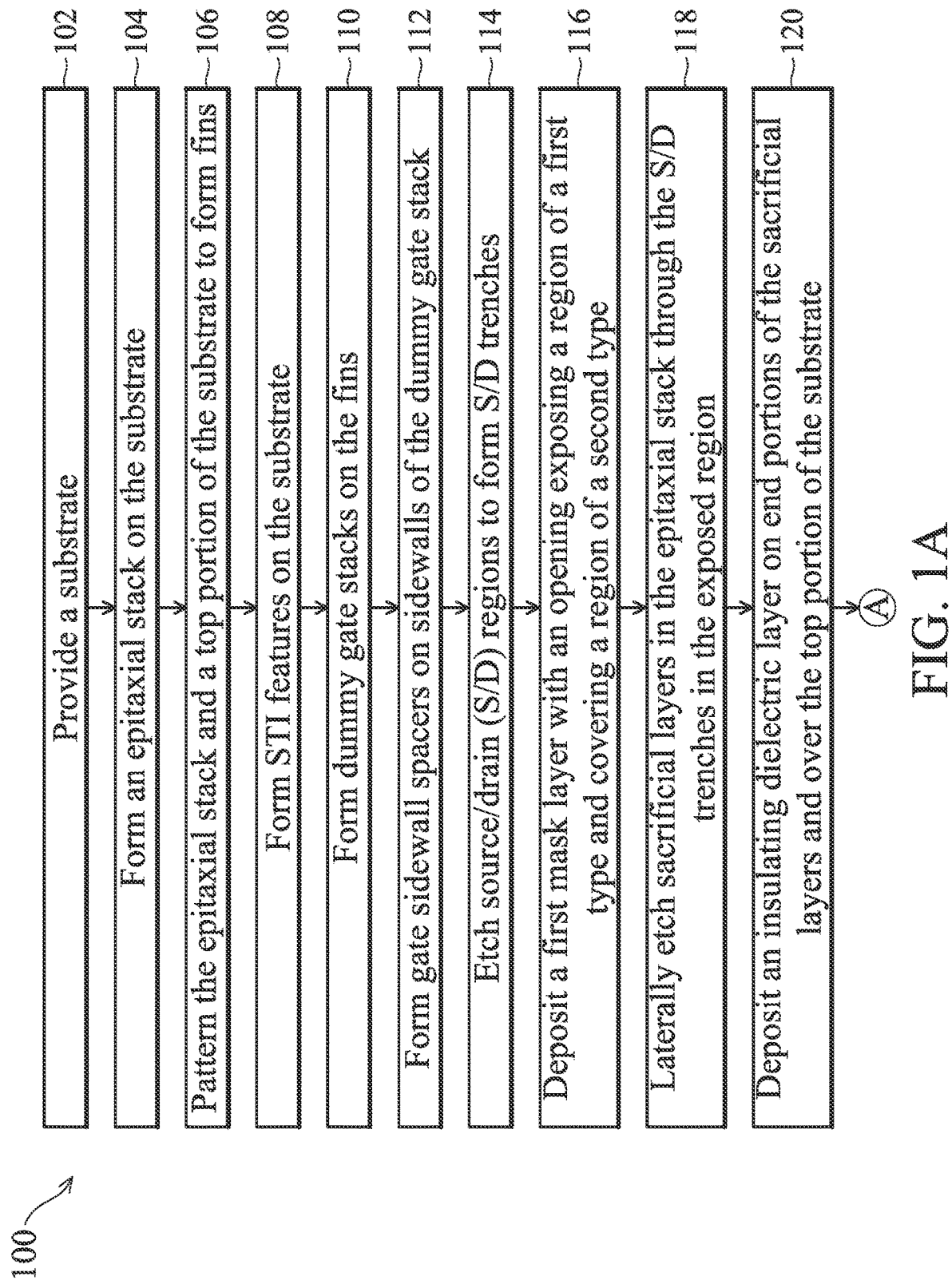
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor fabrication of multi-gate transistors in a semiconductor device. As used herein, a semiconductor device refers to for example, one or more transistors, integrated circuits, a semiconductor chip (e.g., memory chip, logic chip on a semiconductor die), a stack of semiconductor chips, a semiconductor package, a semiconductor wafer, and the like. The term "multi-gate transistor" refers to a transistor, such as a field effect transistor (FET) that has gate material(s) disposed on multiple sides of a channel structure of the transistor. In some examples, the multi-gate transistor is referred to as a gate-all around (GAA) transistor when gate material(s) are disposed on at least four sides of a channel structure of the multi-gate transistor. The term "channel structure" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. In some examples, the channel structure is referred to as a "nanowire", a "nanosheet", and the like that as used herein includes channel structures of various geometries (e.g., cylindrical, bar-shaped) and various dimensions. Conventionally in a GAA process flow, a gate structure extending around the stacked channel structures also directly engages a top surface of a semiconductor substrate under the bottommost channel structure, causing strong leakage current flowing between the gate structure and source/drain (S/D) features. An object of the present disclosure is to devise an insulating feature interposing the S/D features and the semiconductor structures thereunder so as to suppress the leakage current.

Figure 1B:
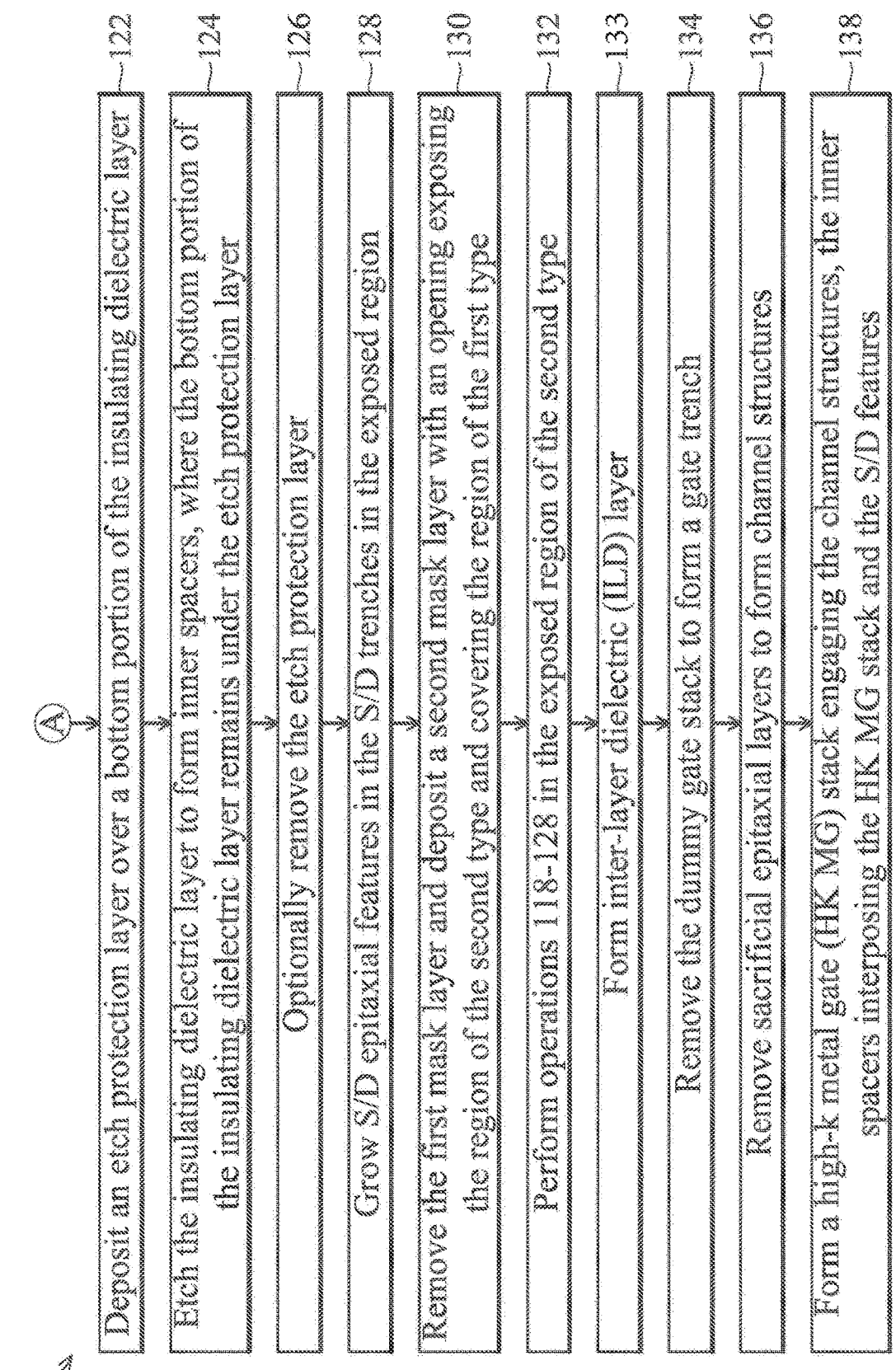

FIGS. 1A and 1B illustrate a flow chart of a method 100 for forming n-type and/or p-type GAA transistors with leakage current suppression according to various aspects of the present disclosure. A GAA transistor has gate material(s) disposed on four sides of at least one channel structure of the device. Presented herein are embodiments of GAA transistors that may have multiple channel structures (e.g., nanosheets) associated with a single, contiguous gate structure. However, one of ordinary skill would recognize that the teaching can apply to a single channel structure (e.g., a single nanosheet) or any number of channel structures. One of ordinary skill may recognize other examples of semiconductor devices that may benefit from aspects of the present disclosure.

FIGS. 1A and 1B will be described below in conjunction with FIGS. 2-25B. FIGS. 2-9 are diagrammatic perspective views of a semiconductor device 200 at intermediate stages of fabrication according to method 100. FIGS. 10A, 11A, 12A, 13A, 14A, 15A, 16A, 17A, 18A, 19A, 20A, 21A, 22A, 23A, 24A, and 25A are fragmentary cross-sectional views in an n-type FET region (along the A-A line) of the semiconductor device 200 in FIG. 9 at various other stages of fabrication according to method 100, which is a cut through a channel region along a lengthwise direction of stacked channel structures. FIGS. 10B, 11B, 12B, 13B, 14B, 15B, 16B, 17B, 18B, 19B, 20B, 21B, 22B, 23B, 24B, and 25B are fragmentary cross-sectional views in the n-type FET region (along the B-B line) of the semiconductor device 200 in FIG. 9 at various other stages of fabrication according to method 100, which is a cut in a source/drain region perpendicular to the lengthwise direction of stacked channel structures. The method 100 is merely an example, and is not intended to limit the present disclosure beyond what is explicitly recited in the claims. Additional steps can be provided before, during, and after method 100, and some of the steps described can be moved, replaced, or eliminated for additional embodiments of method 100. Additional features can be added in the semiconductor device depicted in FIGS. 2-25B and some of the features described below can be replaced, modified, or eliminated in other embodiments of the semiconductor device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including p-type FETs, n-type FETs, etc., which may be interconnected. Moreover, it is noted that the process steps of method 100, including any descriptions given with reference to FIGS. 2-25B, as with the remainder of the method and exemplary figures provided in this disclosure, are merely exemplary and are not intended to be limiting beyond what is specifically recited in the claims that follow.

Figure 2:
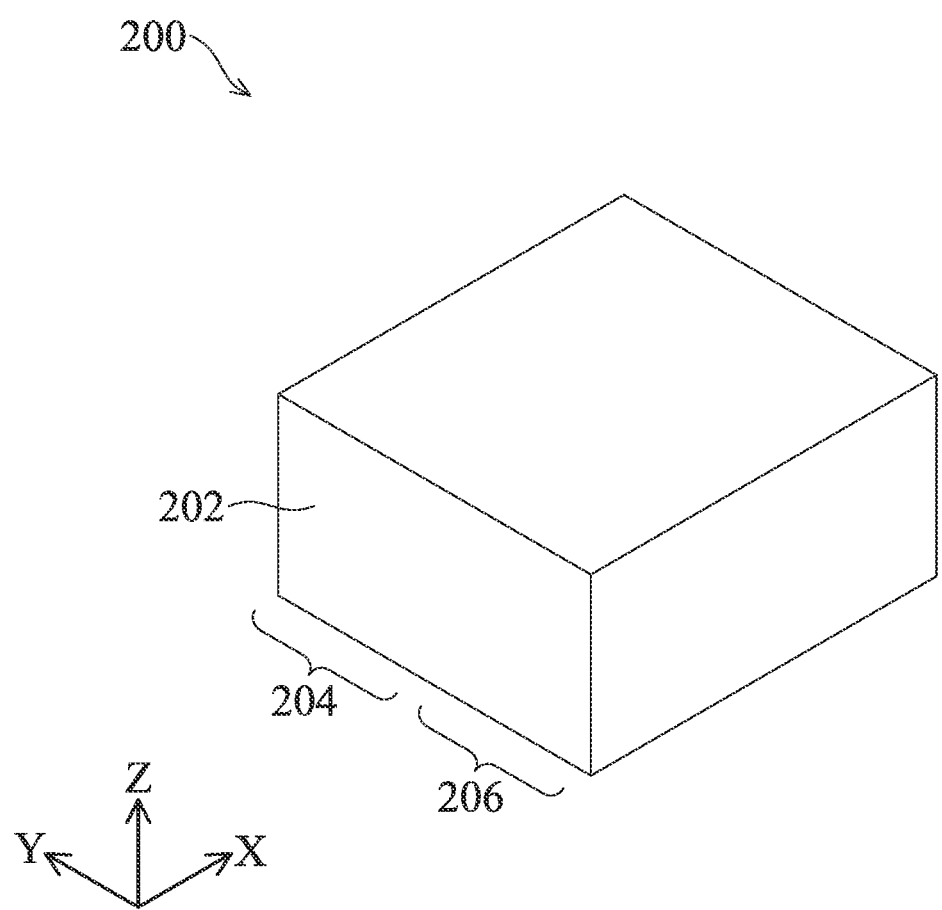
FIGS. 2, 3, 4, 5, 6, 7, 8, and 9 are perspective views of a semiconductor device constructed according to the method in FIGS. 1A and 1B, in accordance with some embodiments.

At operation 102, the method 100 (FIG. 1A) provides a semiconductor substrate 202 (also referred to as the substrate 202), as shown in FIG. 2. In some embodiments, the substrate 202 may be a semiconductor substrate such as a silicon (Si) substrate. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. The substrate 202 may include various doping configurations depending on design requirements as is known in the art. For example, in the illustrated embodiment, the substrate 202 is separated into regions 204 and 206. As to be explained in greater detail below, two or more transistors are formed in and/or over the regions 204 and 206 of the substrate 202. In some embodiments, an n-type FET (NFET) and a p-type FET (PFET) will be formed in and/or over the regions 204 and 206, respectively. Thus, the region 204 is also referred to as the NFET region 204 and the region 206 is also referred to as the PFET region 206 in the present disclosure. The regions 204 and 206 may include various doping configurations depending on design requirements as is known in the art. For example, different doping profiles (e.g., a p-well in the region 204 and an n-well in the region 206) may be formed in the respective regions designed for different device types (e.g., NFETs or PFETs). The suitable doping may include ion implantation of dopants and/or diffusion processes, such as boron (B) for forming a p-well in the region 204 and phosphorous (P) for forming an n-well in the region 206.

Figure 3:
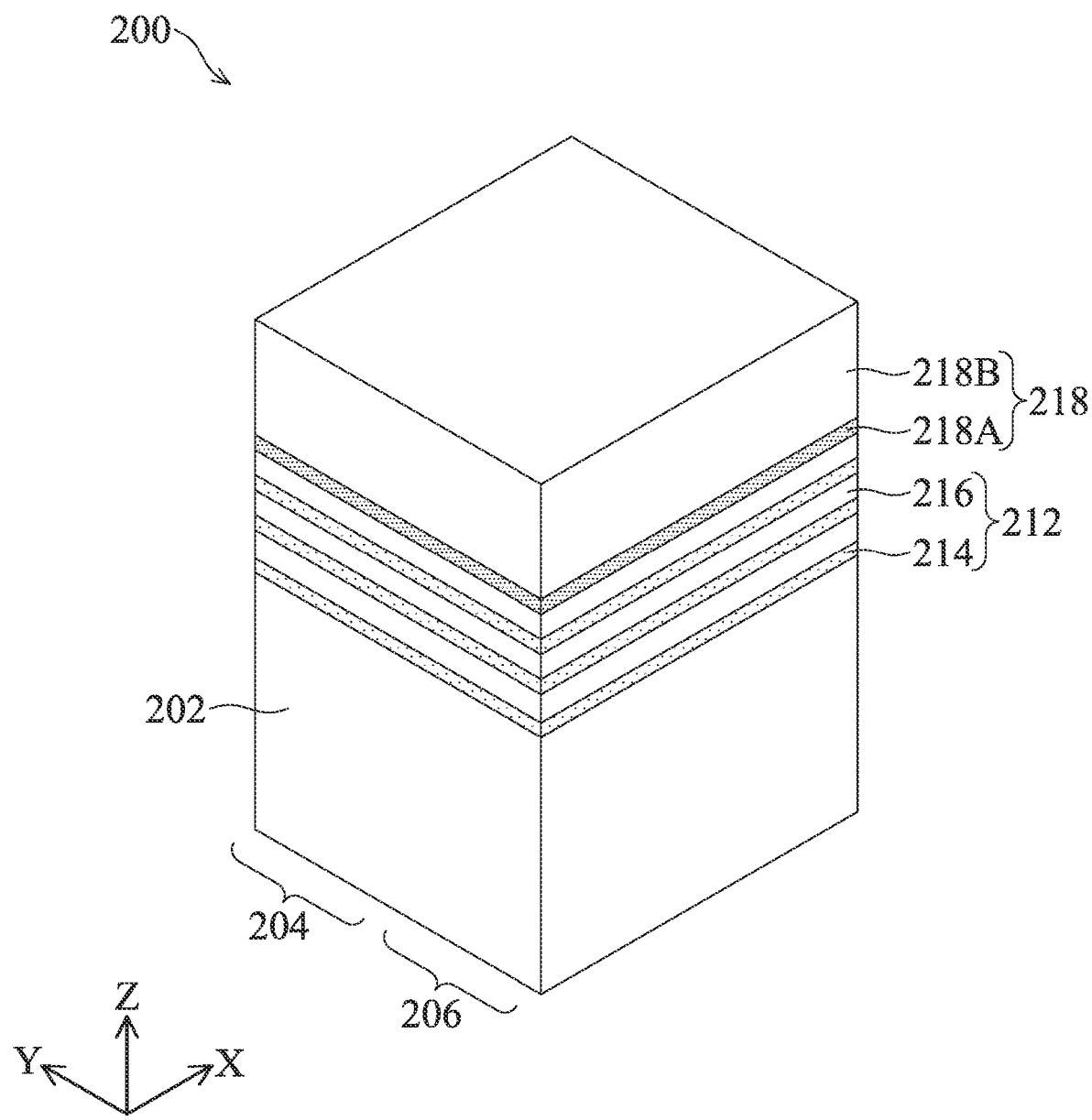

At operation 104, the method 100 (FIG. 1A) forms one or more epitaxial layers over the substrate 202, as shown in FIG. 3. In some embodiments, an epitaxial stack 212 is formed over the regions 204 and 206. The epitaxial stack 212 includes epitaxial layers 214 of a first composition interposed by epitaxial layers 216 of a second composition. The first and second composition can be different. In an embodiment, the epitaxial layers 214 are SiGe and the epitaxial layers 216 are silicon. However, other embodiments are possible including those that provide for a first composition and a second composition having different oxidation rates and/or etch selectivity. In some embodiments, the epitaxial layer 214 includes SiGe and where the epitaxial layer 216 includes silicon, the silicon oxidation rate is less than the SiGe oxidation rate. It is noted that three (3) layers of each of the epitaxial layers 214 and 216 are illustrated in FIG. 3, which is for illustrative purposes only and not intended to be limiting beyond what is specifically recited in the claims. It can be appreciated that any number of epitaxial layers can be formed in the epitaxial stack 212; the number of layers depending on the desired number of channel structures for the device 200. In some embodiments, the number of epitaxial layers 216 is between 2 and 10, such as 4 or 5.

In some embodiments, the epitaxial layer 214 has a thickness ranging from about 4 nm to about 12 nm. The epitaxial layers 214 of the stack are substantially uniform in thickness. In some embodiments, the epitaxial layer 216 has a thickness ranging from about 3 nm to about 6 nm. In some embodiments, the epitaxial layers 216 of the stack are substantially uniform in thickness. As described in more detail below, the epitaxial layer 216 may serve as channel region(s) for a subsequently-formed multi-gate device and its thickness is chosen based on device performance considerations. The epitaxial layer 214 may serve to reserve a spacing (or referred to as a gap) between adjacent channel region(s) for a subsequently-formed multi-gate device and its thickness is chosen based on device performance considerations. The epitaxial layer 214 is also referred to the sacrificial layer 214 and the epitaxial layer 216 is also referred to as the channel layer 216 or the channel structure 216.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the layers 216, include the same material as the substrate 202, such as silicon (Si). In some embodiments, the epitaxially grown layers 214 and 216 include a different material than the substrate 202. As stated above, in at least some examples, the epitaxial layer 214 includes an epitaxially grown $Si_{1-x}Ge_x$ layer (e.g., x is about 25~55%) and the epitaxial layer 216 includes an epitaxially grown Si layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation and etch selectivity properties. In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

Further, a mask layer 218 is formed over the epitaxial stack 212. In some embodiments, the mask layer 218 includes a first mask layer 218A and a second mask layer 218B. The first mask layer 218A is a pad oxide layer made of silicon oxide, which can be formed by a thermal oxidation process. The second mask layer 218B is made of silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Figure 4:
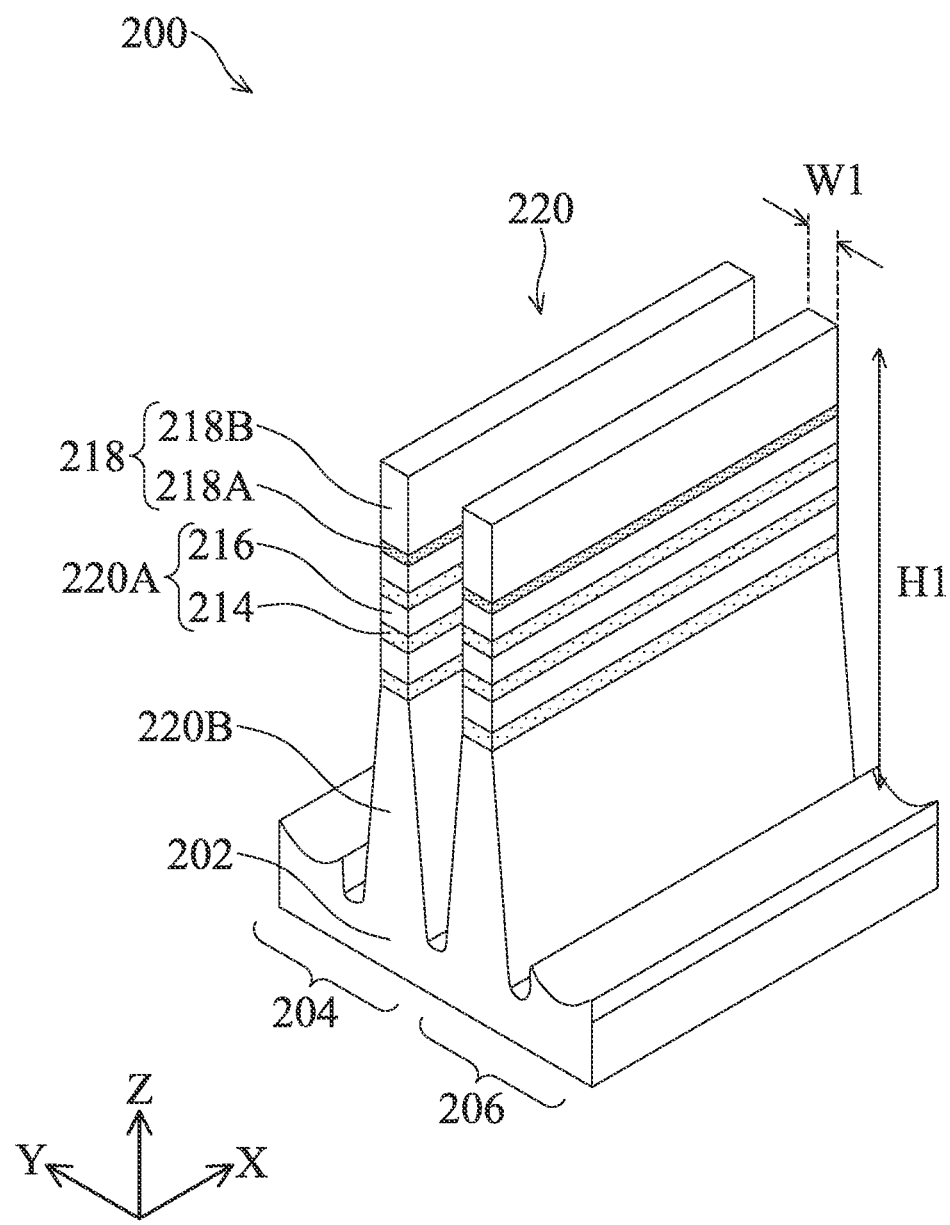

At operation 106, the method 100 (FIG. 1A) patterns the epitaxial stack 212 to form semiconductor fins 220 (also referred to as fins 220), as shown in FIG. 4. In various embodiments, each of the fins 220 includes an upper portion 220A (also termed as epitaxial portion 220A) of the inter leaved epitaxial layers 214 and 216 and a bottom portion 220B that is formed by patterning a top portion of the substrate 202. The bottom portion 220B still has a fin shape protruding from the substrate 202 and is also termed as the fin-shape base 220B. The mask layer 218 is patterned into a mask pattern by using patterning operations including photo-lithography and etching. In some embodiments, operation 106 patterns the epitaxial stack 212 using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the epitaxial stack 212 in an etching process, such as a dry etch (e.g., reactive ion etching), a wet etch, and/or other suitable process, through openings defined in the patterned mask layer 218. The stacked epitaxial layers 214 and 216 are thereby patterned into fins 220 with trenches between adjacent fins. Each of the fins 220 protrudes upwardly in the z-direction from the substrate 202 and extends lengthwise in the x-direction. In FIG. 4, two (2) fins 220 are spaced apart along the y-direction with one fin disposed above the NFET region 204 and one fin disposed above the PFET region 206. But the number of the fins is not limited to two, and may be as small as one or more than two. In some embodiments, one or more dummy fin structures are formed on both sides of the fins 220 to improve pattern fidelity in the patterning operations. The width W1 of the upper portion of the fins 220 along the y-direction is in a range from about 10 nm to about 40 nm in some embodiments, or in a range from about 20 nm to about 30 nm in other embodiments. The height H1 along the Z direction of the fins 220 is in a range from about 100 nm to about 200 nm in some embodiments.

Figure 5:
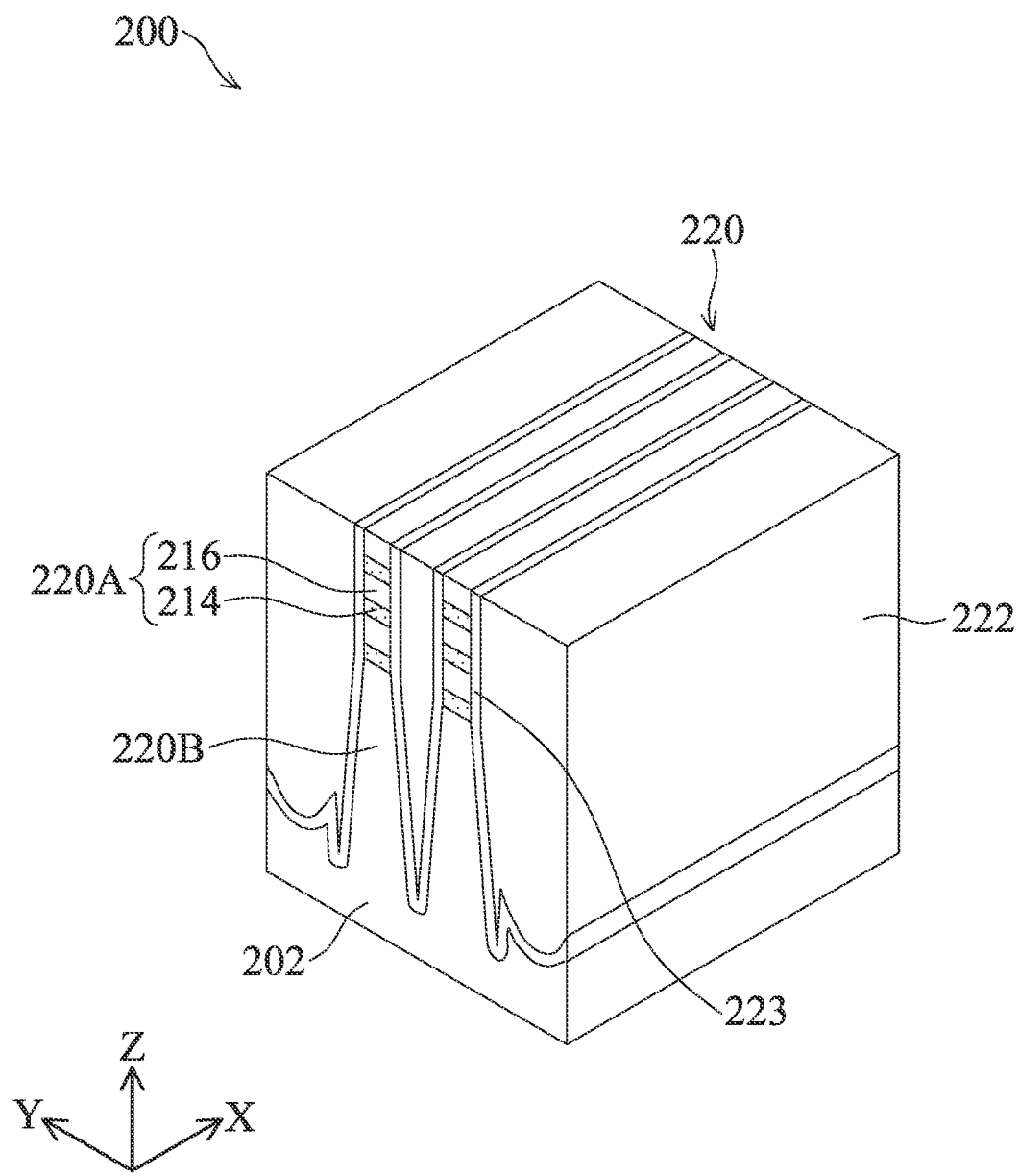
Figure 6:
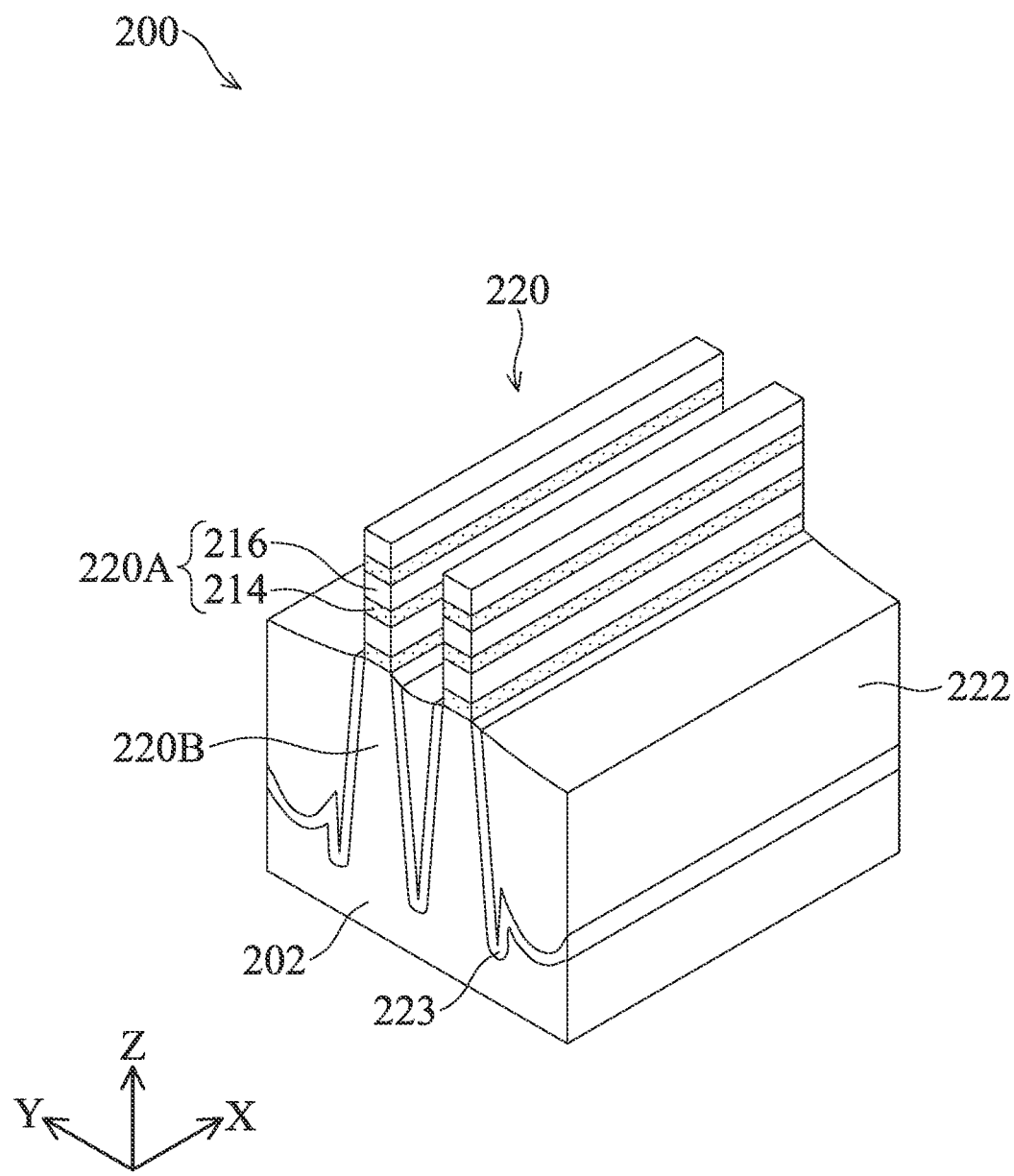

At operation 108, the method 100 (FIG. 1A) fills the trenches between adjacent fins 220 with a dielectric material to form an isolation feature 222, as shown in FIG. 5. The isolation feature 222 may include one or more dielectric layers. Suitable dielectric materials for the isolation feature 222 may include silicon oxides, silicon nitrides, silicon carbides, fluorosilicate glass (FSG), low-K dielectric materials, and/or other suitable dielectric materials. The dielectric material may be deposited by any suitable technique including thermal growth, CVD, HDP-CVD, PVD, ALD, and/or spin-on techniques. Then, a planarization operation, such as a chemical mechanical polishing (CMP) method, is performed such that the upper surface of the topmost second semiconductor layer 216 is exposed from the insulating feature 222. Operation 108 subsequently recesses the isolation features 222 to form shallow trench isolation (STI) features (also denoted as STI features 222), as shown in FIG. 6. Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220. In some embodiments, the mask layer 218 is removed by a CMP process performed prior to the recessing of the isolation features 222. In some embodiments, the mask layer 218 is removed by an etchant used to recess the isolation features 222. In the illustrated embodiment, the STI feature 222 is disposed on sidewalls of the fin-shape base 220B. A top surface of the STI feature 222 may be coplanar with a bottom surface of the epitaxial portion 220A (or a top surface of the fin-shape base 220B) or below the bottom surface of the epitaxial portion 220A (or the top surface of the fin-shape base 220B) for about 1 nm to about 10 nm. In some embodiments, a liner layer 223 is blanket deposited over the fins 220 before depositing the isolation feature 222, as shown FIG. 5. In some embodiments, the liner layer 223 is made of SiN or a silicon nitride-based material (e.g., SiON, SiCN or SiOCN). Then, as shown in FIG. 6, liner layer 223 is recessed so that the epitaxial portion 220A of the fins 220 are exposed.

Figure 7:
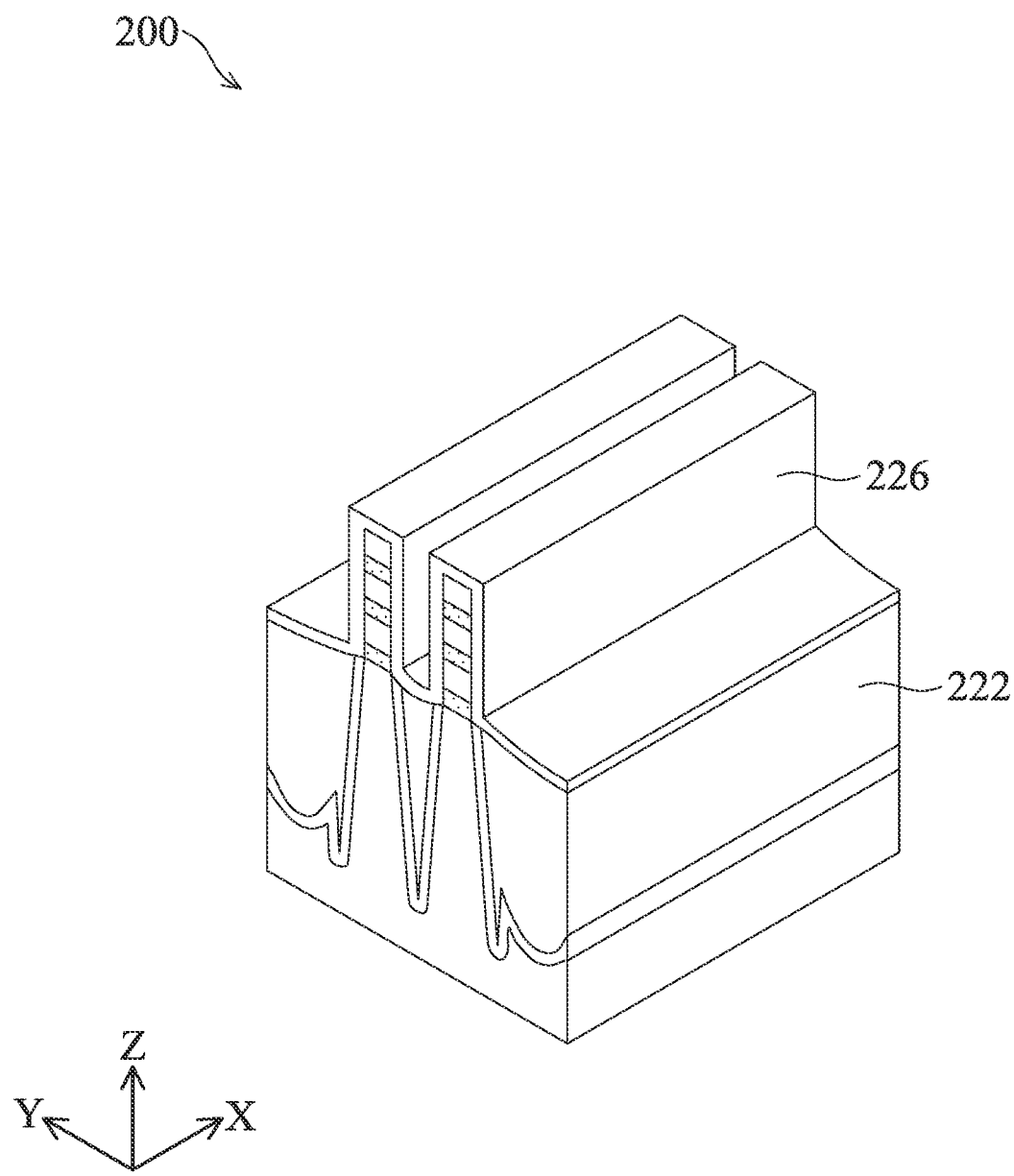
Figure 8:
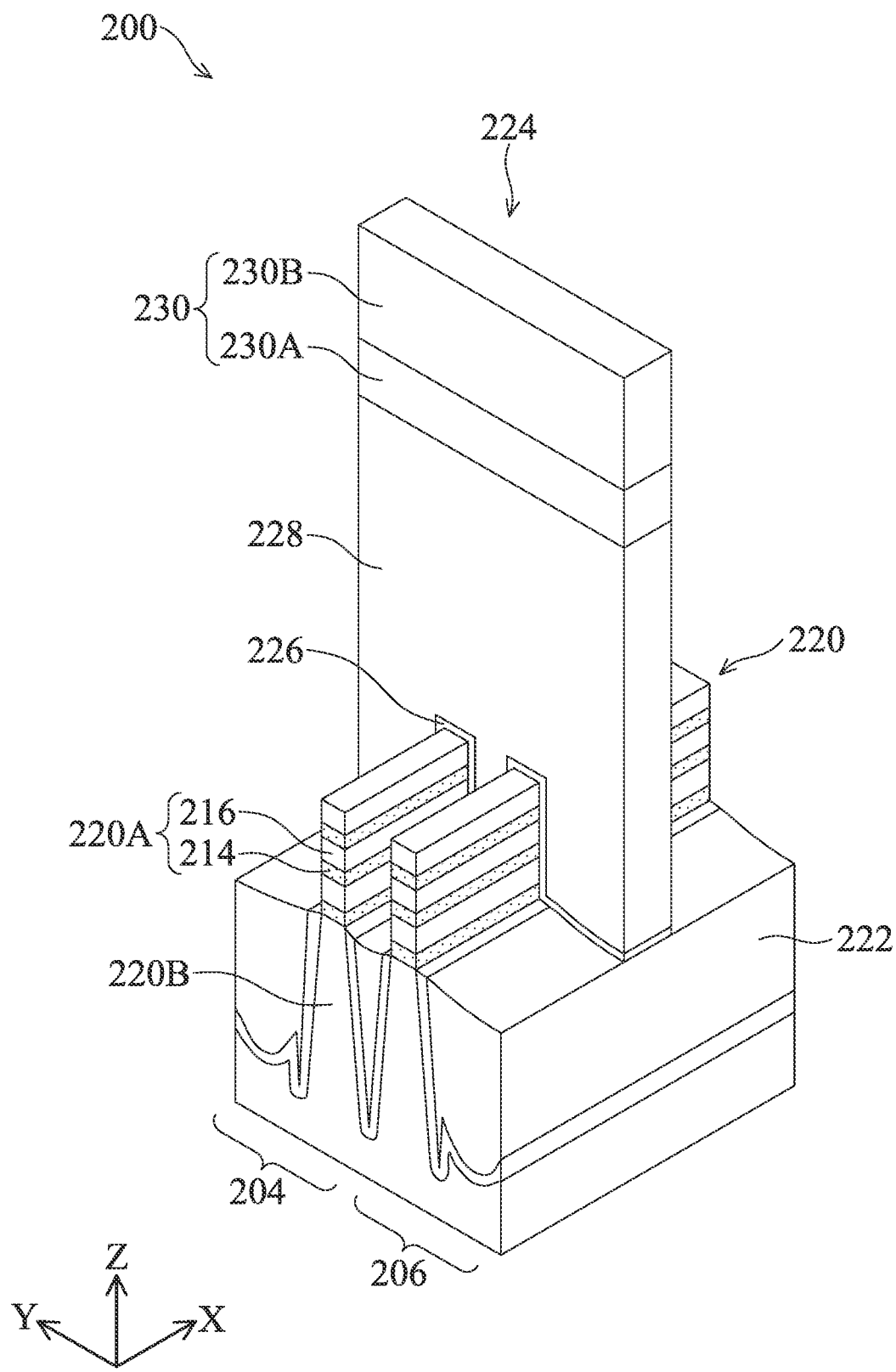

Referring to FIGS. 1A and 7-8, method 100 proceeds to operation 110 where sacrificial layers/features are formed and in particular, a sacrificial (dummy) gate structure. While the present discussion is directed to a replacement gate process whereby a sacrificial gate structure is formed and subsequently replaced, other configurations may be possible. With reference to FIG. 7, after the STI feature 222 is formed, a sacrificial gate dielectric layer 226 is formed. The sacrificial gate dielectric layer 226 includes one or more layers of insulating material, such as a silicon oxide-based material. In one embodiment, silicon oxide formed by CVD is used. The thickness of the sacrificial gate dielectric layer 226 is in a range from about 1 nm to about 5 nm in some embodiments.

FIG. 8 illustrates a resultant structure after a sacrificial gate structure 224 is formed over the exposed fins 220. The sacrificial gate structure 224 is formed over a portion of the fins 220 which is to be a channel region. Thus, the sacrificial gate structure 224 defines the channel region of the device 200. The sacrificial gate structure 224 is formed by first blanket depositing the sacrificial gate dielectric layer 226 over the fins 220, as discussed above. A sacrificial gate electrode layer is then deposited on the sacrificial gate dielectric layer 226 and over the fins 220, such that the fins 220 are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer 230 is formed over the sacrificial gate electrode layer. The mask layer 230 includes a pad SiN layer 230A and a silicon oxide mask layer 230B. Next, a patterning operation is performed on the mask layer 230 and the sacrificial gate electrode layer is patterned into the sacrificial gate electrode 228, as shown in FIG. 8. The sacrificial gate structure 224 includes the sacrificial gate dielectric layer 226, the sacrificial gate electrode 228 (e.g., poly silicon), the pad SiN layer 230A, and the silicon oxide mask layer 230B. By patterning the sacrificial gate structure, the stacked epitaxial layers 214 and 216 are partially exposed on opposite sides of the sacrificial gate structure 224, thereby defining source/drain (S/D) regions. In this disclosure, a source and a drain are interchangeably used and the structures thereof are substantially the same. In FIG. 8, one sacrificial gate structure 224 is formed, but the number of the sacrificial gate structures 224 is not limited to one, two, or more sacrificial gate structures, which are arranged in the X direction in some embodiments. For example, the to-be-formed GAA transistors in each of the NFET region 204 and PFET region 206 may have separated sacrificial gate structures.

Figure 9:
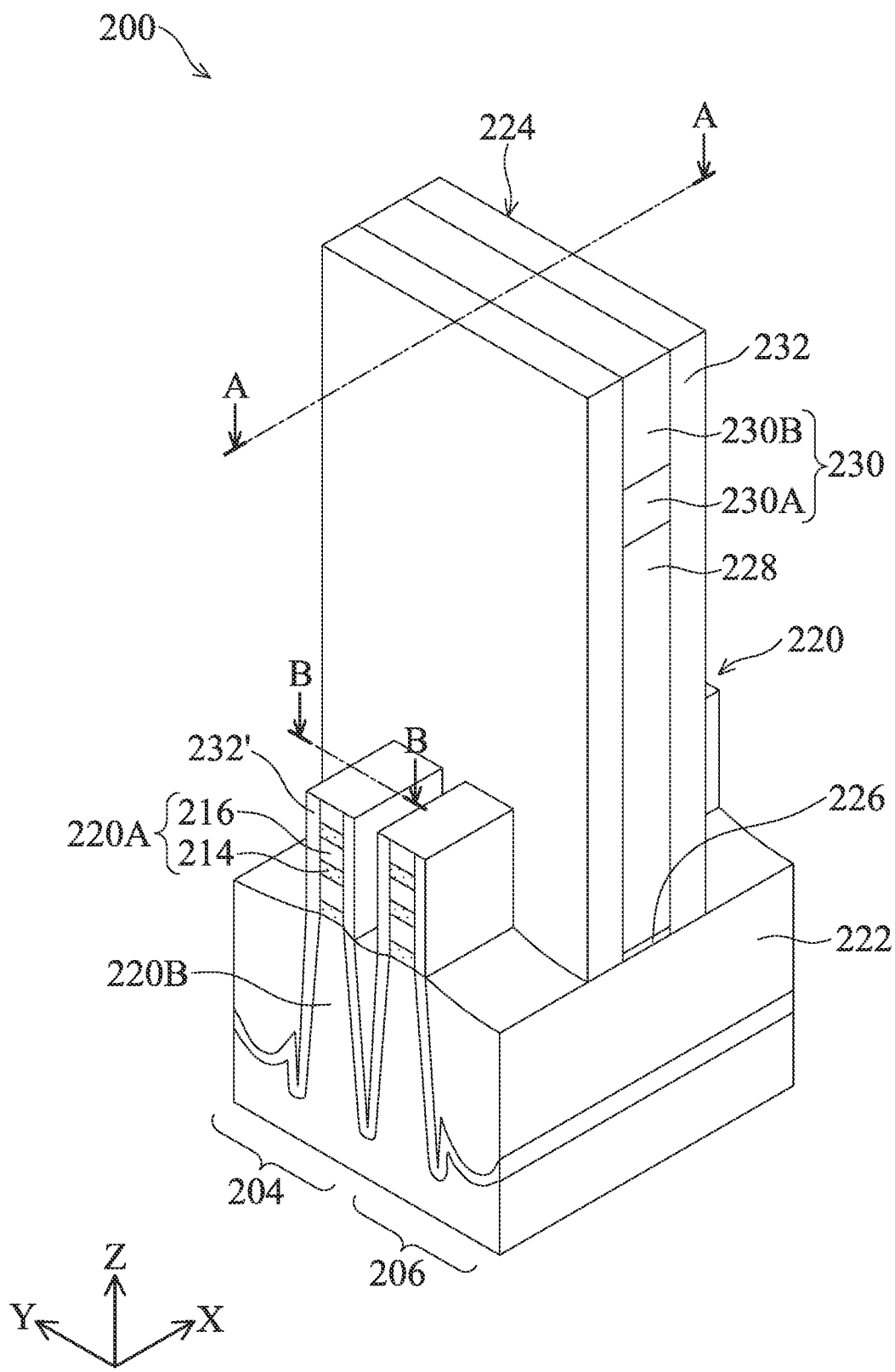

At operation 112, the method 100 (FIG. 1A) forms gate spacers 232 on sidewalls of the sacrificial gate structure 224, as shown in FIG. 9. Cross-sectional views along A-A line (lengthwise direction of the fin 220 above the NFET region 204) and B-B line (source/drain region) of the resultant structure after operation 112 are also illustrated in FIGS. 10A and 10B, which are cuts through the NFET region 204. The cross-sectional views cut through the PFET region 206 are similar to what are illustrated in FIGS. 10A and 10B and omitted herein for the sake of simplicity. The gate spacers 232 may also cover sidewalls of the fins 220, which are termed as fin spacers 232' for this portion of gate spacers. The gate spacers 232 may include a dielectric material such as silicon oxide, silicon nitride, silicon carbide, silicon oxynitride, SiCN films, silicon oxycarbide, SiOCN films, and/or combinations thereof. In some embodiments, the gate spacers 232 include multiple layers, such as main spacer walls, liner layers, and the like. By way of example, the gate spacers 232 may be formed by blanket depositing a dielectric material layer in a conformal manner over the sacrificial gate structure 224 using processes such as, a CVD process, a subatmospheric CVD (SACVD) process, a flowable CVD process, an ALD process, a PVD process, or other suitable process. In the illustrated embodiment, the deposition of the dielectric material layer is followed by an etching-back (e.g., anisotropically) process to remove the dielectric material layer from horizontal surfaces and expose top surface of the sacrificial gate structure 224 and top surface of the fins 220 adjacent to but not covered by the sacrificial gate structure 224 (e.g., S/D regions). The dielectric material layer may remain on the sidewalls of the sacrificial gate structure 224 as gate spacers 232 (and/or on the sidewalls of the fins 220 as fin spacers 232'). In some embodiments, the etching-back process may include a wet etch process, a dry etch process, a multiple-step etch process, and/or a combination thereof. The gate spacers 232 may have a thickness ranging from about 5 nm to about 20 nm.

At operation 114, the method 100 (FIG. 1A) recesses portions of the fins 220 to form S/D trenches 234 (or termed as S/D recesses 234) in the S/D regions, as shown in FIGS. 11A and 11B. The stacked epitaxial layers 214 and 216 are etched down at the S/D regions. In the illustrated embodiment, a top portion of the fin-shape base 220B is also recessed to a position below a top surface of the STI feature 222 (FIG. 11B). In many embodiments, operation 114 forms the S/D recesses 234 by a suitable etching process, such as a dry etching process, a wet etching process, or an RIE process. The etching process at operation 114 may implement a dry etching process using an etchant including a bromine-containing gas (e.g., HBr and/or CHBr$_3$), a fluorine-containing gas (e.g., CF$_4$, SF$_6$, CH$_2$F$_2$, CHF$_3$, and/or C$_2$F$_6$), other suitable gases, or combinations thereof.

Still referring to FIGS. 11A and 11B, at operation 116, the method 100 (FIG. 1A) forms a patterned mask layer 236 with openings exposing the S/D recesses 234 in the NFET region 204, while the PFET region 206 and other features (e.g., sacrificial gate structure 224) in the NFET region 204 are covered by the patterned mask layer 236. The patterned mask layer 236 restrains the subsequent fabrication processes to the NFET region 204 until it is later on removed. The sequence of applying subsequent fabrication processes to the NFET region 204 before the PFET region 206 is for illustrative purposes only and does not limit the present disclosure. Alternatively, the patterned mask layer 236 may cover the NFET region 204 with openings exposing S/D recesses 234 in the PFET region 206 to allow applying subsequent fabrication processes to the PFET region 206 before the NFET region 204. Further, operation 116 may be optional and skipped in some embodiments, allowing the subsequent fabrication processes (e.g., operations 118-128) to be applied to both regions simultaneously. By way of example, the patterned mask layer 236 is made of silicon nitride (SiN), which is blanket deposited by chemical vapor deposition (CVD), including low pressure CVD (LPCVD) and plasma enhanced CVD (PECVD), physical vapor deposition (PVD), atomic layer deposition (ALD), or other suitable process. The mask layer 236 is patterned using any suitable methods such as a photolithography process, which may include forming a resist layer on the mask layer 236, exposing the resist by a lithography exposure process, performing a post-exposure bake process, developing the resist layer to form the patterned resist layer that exposes part of the mask layer 236, patterning the mask layer 236, and finally removing the patterned resist layer. The lithography process may be alternatively replaced by other suitable techniques, such as e-beam writing, ion-beam writing, maskless patterning or molecular printing.

At operation 118, the method 100 (FIG. 1A) laterally etches end portions of the epitaxial layers 214, thereby forming cavities 238, as shown in FIGS. 12A and 12B. The amount of the etching of the epitaxial layers 214 is in a range from about 1 nm to about 4 nm in some embodiments. The epitaxial layers 214 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. Alternatively, operation 118 may first selectively oxidize lateral ends of the epitaxial layers 214 that are exposed in the S/D recesses 234 to increase the etch selectivity between the epitaxial layers 214 and 216. In some examples, the oxidation process may be performed by exposing the device 200 to a wet oxidation process, a dry oxidation process, or a combination thereof.

At operation 120, the method 100 (FIG. 1A) blanket deposits an insulating dielectric layer 240 in the SD recesses 234, as shown in FIGS. 13A and 13B. Particularly, the insulating dielectric layer 240 is deposited on the lateral ends of the epitaxial layers 214 exposed in the cavities 238 and on the sidewalls of the epitaxial layers 216 exposed in the S/D recesses 234. The insulating dielectric layer 240 also covers the fin spacers 232', the fin-shape base 220B, and the STI feature 222. The insulating dielectric layer 240 may include silicon oxides, silicon nitrides, silicon carbides, silicon carbide nitride, silicon oxide carbide, silicon carbide oxynitride, and/or other suitable dielectric materials. In some embodiments, the insulating dielectric layer 240 is deposited as a conformal layer with substantially uniform thickness on different surfaces. The insulating dielectric layer 240 can be formed by ALD or any other suitable method. By conformally forming the insulating dielectric layer 240, a volume of the cavities 238 is reduced or completely filled.

Figure 14B:
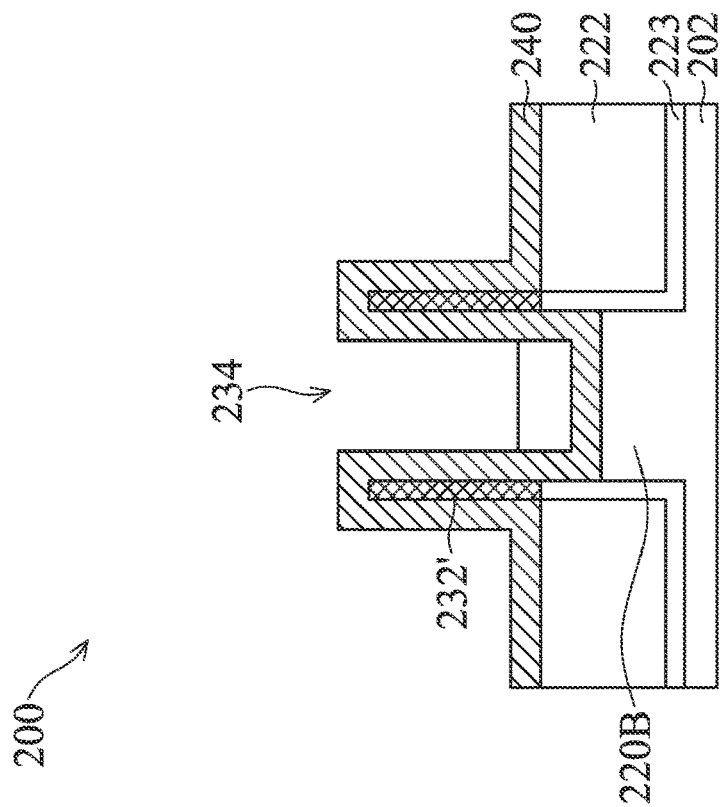
Figure 14A:
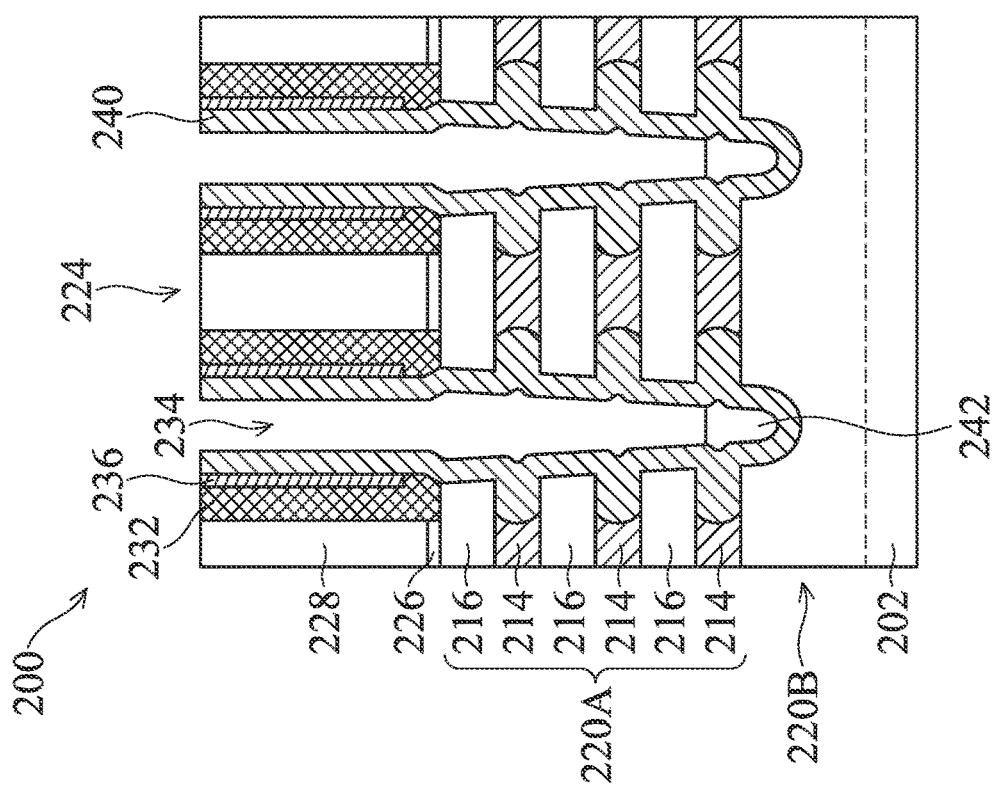

At operation 122, the method 100 (FIG. 1B) forms an etch protection layer 242 over a bottom portion of the insulating dielectric layer 240 and thus over the top surface of the fin-shape base 220B, as shown in FIGS. 14A and 14B. In some embodiments, the etch protection layer 242 includes silicon oxide ($SiO_2$), aluminum oxide (AlO), silicon nitride (SiN), silicon oxynitride (SiON), silicon carbonitride (SiCN), silicon carbon oxynitride (SiCON). Generally, the composition of the etch protection layer 242 and the insulating dielectric layer 240 are selected such that there is a high etch selectivity therebetween. The etch protection layer 242 protects the bottom portion of the insulating dielectric layer 240 thereunder from being removed in subsequent etching processes. In some embodiments, the etch protection layer 242 is first deposited in the S/D recess 234 using CVD, PVD, ALD, or other suitable process, covering the insulating dielectric layer 240. Subsequently, an etching-back process is performed to recess the etch protection layer 242 to a determined height (e.g., by controlling the etching time), such that an upper portion of the insulating dielectric layer 240 is exposed. In various embodiments, a top surface of the recessed etch protection layer 242 is below a bottom surface of the bottommost epitaxial layer 216. Referring to FIG. 14B, the top surface of the recessed etch protection layer 242 is above the STI feature 222 and the liner layer 223. Alternatively, the top surface of the recessed etch protection layer 242 may be below the STI feature 222 and the liner layer 223 in accordance with some embodiments.

Figures 15A, 15B:
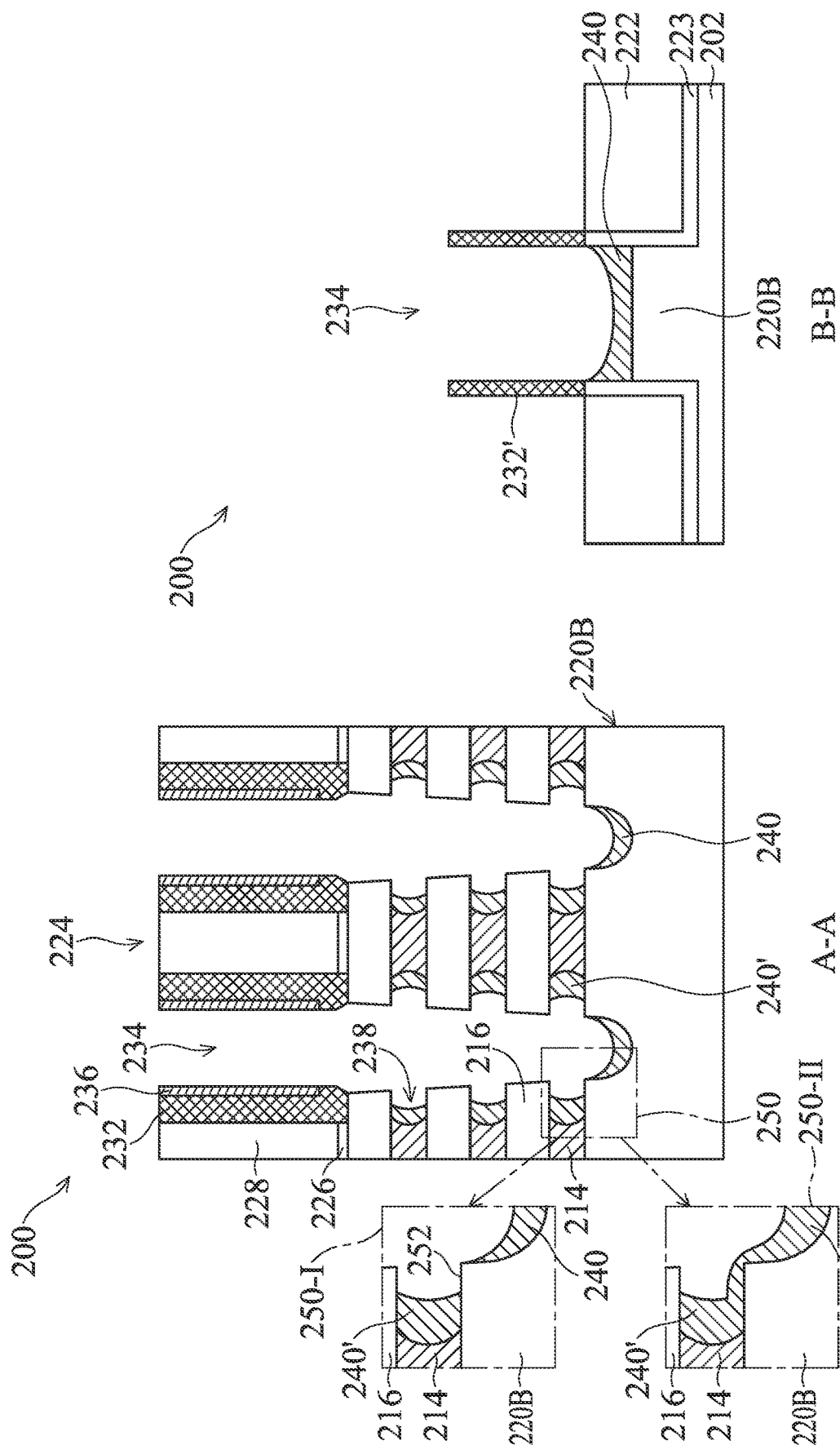

At operation 124, the method 100 (FIG. 1B) partially removes the insulating dielectric layer 240 from the S/D recesses 234 in an etching process, as shown in FIGS. 15A and 15B. By this etching, the insulating dielectric layer 240 remains substantially within the cavity 238, because of a small volume of the cavity. Generally, plasma dry etching etches a layer in wide and flat areas faster than a layer in concave (e.g., holes, grooves and/or slits) portions. Thus, the insulating dielectric layer 240 can remain inside the cavities 238. The remained portions of the insulating dielectric layer 240 inside the cavities 238 provides isolation between to-be-formed metal gate structure and to-be-formed S/D features, which are herein denoted as the inner spacers 240'. Besides the portions of the insulating dielectric layer 240 in the cavities 238, the bottom portion of the insulating dielectric layer 240 covered by the etch protection layer 242 also remains. Referring to FIG. 15B, in one embodiment, the top surface of the bottom portion of the insulating dielectric layer 240 has a concave shape and below the STI feature 222 and the liner layer 223. If there is no the etch protection layer 242, the bottom portion of the insulating dielectric layer 240 would be otherwise removed. The amount of the insulating dielectric layer 240 remaining on the top surface of the fin-shape base 220B depends on the coverage of the etch protection layer 242 after previous operation 122. Referring to a region 250 at the bottom of the S/D recess 234 (represented by dotted square box numerated as 250 in FIG. 15A), in one embodiment (represented by 250-I, an enlarged replica of the region 250) the bottom portion of the insulating dielectric layer 240 is spaced from the bottommost inner spacer 240' with a small top surface 252 of the fin-shape base 220B exposed therebetween, due to a smaller coverage of the etch protection layer 242. In yet another embodiment (represented by 250-II, another enlarged replica of the region 250) the bottom portion of the insulating dielectric layer 240 connects with the bottommost inner spacer 240' with the top surface of the fin-shape base 220B fully covered thereunder, due to a larger coverage of the etch protection layer 242.

Still referring to FIGS. 15A and 15B, in some embodiments, the method 100 may optionally proceed to operation 126 (FIG. 1B) to selectively remove the etch protection layer 242 from the S/D recess 234 in a second etching process, while the remaining portions of the insulating dielectric layer 240 remain substantially intact. The etching process can include dry etching, wet etching, reactive ion etching (RIE), and/or other suitable processes.

At operation 128, the method 100 (FIG. 1B) forms epitaxial S/D features 254 in the S/D recesses 234, as shown in FIGS. 16A and 16B. In an embodiment, forming the epitaxial S/D features 254 includes epitaxially growing one or more semiconductor layers by an MBE process, a chemical vapor deposition process, and/or other suitable epitaxial growth processes. In a further embodiment, the epitaxial S/D features 254 are in-situ or ex-situ doped with an n-type dopant or a p-type dopant. For example, in some embodiments, the epitaxial S/D features 254 include silicon doped with phosphorous for forming S/D features for an n-type FET in the NFET region 204. In some embodiments, the epitaxial S/D features 254 include silicon-germanium (SiGe) doped with boron for forming S/D features for a p-type FET in the PFET region 206. In the illustrated embodiment, the PFET region 206 remains covered by the patterned mask 236 and the operation 128 first grows epitaxial S/D features 254 in the NFET region 204. The semiconductor layers of the epitaxial S/D features 254 are selectively grown on different semiconductor surfaces exposed in the S/D recesses 234, such as the lateral ends of the epitaxial layers 216 and the small exposed top surface 252 of the fin-shape base 220B (if not completely covered by the insulating dielectric layer 240). Since the insulating dielectric layer 240 covers a major portion of the top surface of the fin-shape base 220B, the epitaxial growth of the epitaxial S/D features 254 does not take place therefrom. In other words, the insulating dielectric layer 240 effectively decreases available semiconductor surfaces in the bottom portion of the S/D recesses 234 for the epitaxial growth of the epitaxial S/D features 254. Without an available current path (or limited path through the small exposed top surface 252), the leakage current from the fin-shape base 220B (or substrate 202) is significantly reduced. An air gap 256 may be formed between the bottom surface of the epitaxial S/D features 254 and the top surface of the insulating dielectric layer 240. As used herein, the term "air gap" is used to describe a void defined by surrounding substantive features, where a void may contain air, nitrogen, ambient gases, gaseous chemicals used in previous or current processes, or combinations thereof.

At operation 130, the method 100 (FIG. 1B) removes the patterned mask layer 236 thereby exposing the PFET region 206 and subsequently forms a second patterned mask layer 260 with openings exposing S/D recesses 234 in the PFET region 206, while the NFET region 204 and other features (e.g., sacrificial gate structure 224) in the PFET region 206 are covered by the second patterned mask layer 260. The patterned mask layer 236 may be removed by a suitable etching process, such as a dry etching process, a wet etching process, or an RIE process. The resultant structure after the removing of the patterned mask layer 236 is illustrated in FIGS. 17A and 17B. The second patterned mask layer 260 may include silicon nitride (SiN) in an example and blanket deposited by chemical vapor deposition (CVD), including low pressure CVD (LPCVD) and plasma enhanced CVD (PECVD), physical vapor deposition (PVD), atomic layer deposition (ALD), or other suitable process. The second patterned mask layer 260 restrains the subsequent fabrication processes to the PFET region 206 until it is later on removed. In some embodiments, the mask layer 260 is patterned using any suitable methods such as a photolithography process, which may include forming a resist layer on the mask layer 260, exposing the resist by a lithography exposure process, performing a post-exposure bake process, developing the resist layer to form the patterned resist layer that exposes part of the mask layer 260, patterning the mask layer 260, and finally removing the patterned resist layer. The lithography process may be alternatively replaced by other suitable techniques, such as e-beam writing, ion-beam writing, maskless patterning or molecular printing. The resultant structure after the deposition of the second patterned mask layer 260 is illustrated in FIGS. 18A and 18B.

Subsequently, the method 100 proceeds to operation 132 where operations 118-128 are performed to the S/D recesses 234 in the PFET region 206. Due to the similarity in process steps, the repeat of the operations 118-128 is only summarized for simplicity. At operation 118, end portions of the sacrificial epitaxial layers are laterally etched. Cavities are formed abutting etched end portions of the sacrificial epitaxial layers. At operation 120, an insulating dielectric layer is blanket deposited in the S/D recesses and filling the cavities. At operation 122, an etch protection layer is formed above a bottom portion of the insulating dielectric layer. At operation 124, the insulating dielectric layer is partially removed, forming inner spacers in the cavities. Due to the coverage of the etch protection layer, the bottom portion of the insulating dielectric layer remains intact and covering a top surface of the fin-shape base. The bottom portion of the insulating dielectric layer may connect with the bottommost inner spacer to fully cover the top surface of the fin-shape base or be spaced from the bottommost inner spacer with an exposed small top surface of the fin-shape base therebetween. At operation 126, the etching protection layer may be removed, optionally, thereby exposing the bottom portion of the insulating dielectric layer. At operation 128, epitaxial S/D features are formed in the S/D recesses. The bottom portion of the insulating dielectric layer interposes the epitaxial S/D features and the top surface of the fin-shape base, providing isolation therebetween. An air gap may be defined between the epitaxial S/D features and the bottom portion of the insulating dielectric layer. The second patterned mask layer 260 is subsequently removed by a suitable etching process, such as a dry etching process, a wet etching process, or an RIE process.

Upon conclusion of operation 132, the epitaxial S/D features 254 in both the NFET region 204 and the PFET region 206 are spaced from most parts of the top surface of the fin-shape base 220B (or substrate 202) by the insulating dielectric layer 240 and the air gap 256. Even if there is still a small portion of the top surface of the fin-shape base 220B is in physical contact with the epitaxial S/D features 254, the small contact area significantly limits the leakage current under the stacked channel structures.

Figure 19B:
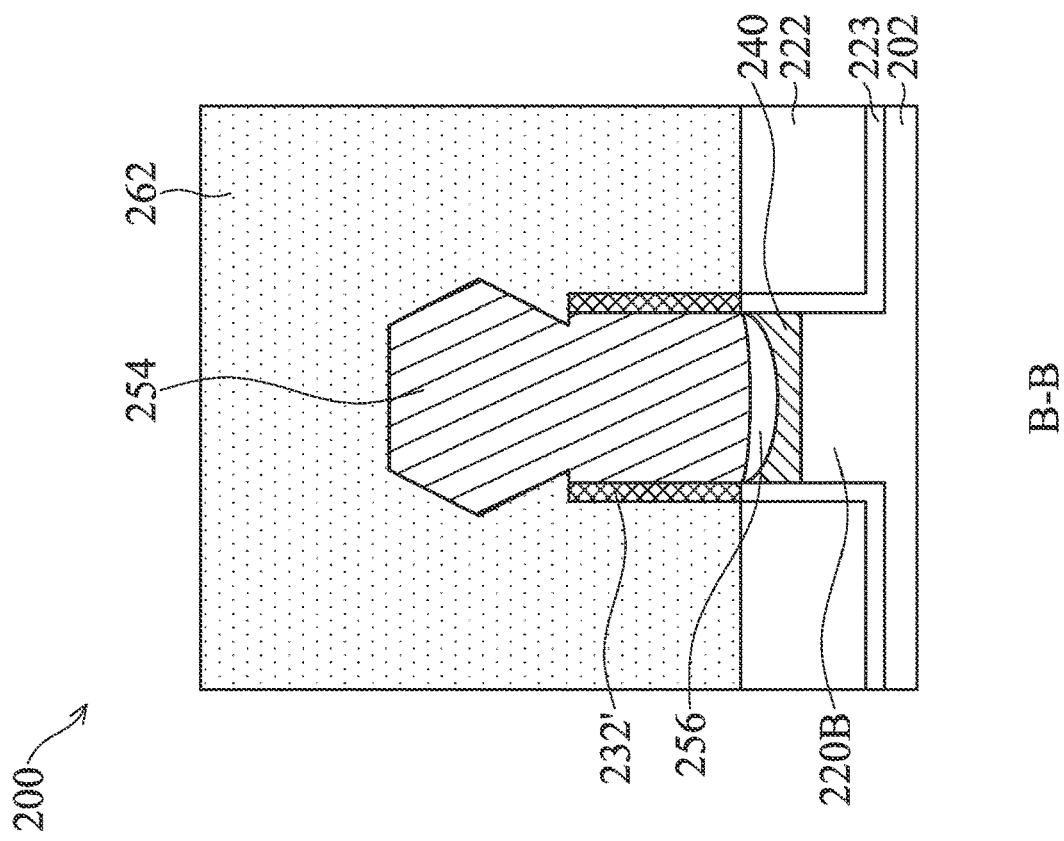
Figure 19A:
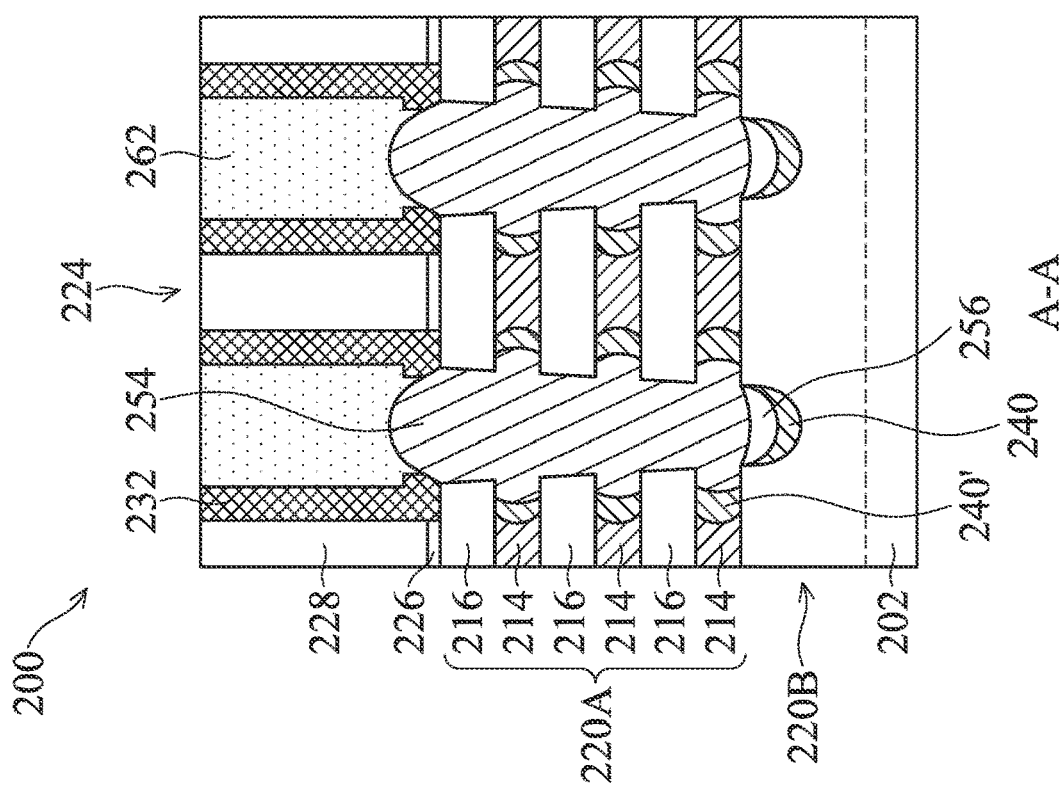

At operation 133, the method 100 (FIG. 1B) forms an interlayer dielectric (ILD) layer 262 over the epitaxial S/D features 254, as shown in FIGS. 19A and 19B. A contact etch stop layer (CESL) (not shown) may also be formed under the ILD layer 262, in accordance with some embodiments. The CESL layer may include silicon nitride, silicon oxynitride, silicon nitride with oxygen (O) or carbon (C) elements, and/or other materials; and may be formed by CVD, PVD (physical vapor deposition), ALD, or other suitable methods. The ILD layer 262 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suit able dielectric materials. The ILD layer 262 may be formed by PECVD or FCVD (flowable CVD), or other suitable methods. In some embodiments, forming the ILD layer 262 further includes performing a CMP process to planarize a top surface of the device 200, such that the top surfaces of the sacrificial gate structures 224 are exposed.

At operation 134, the method 100 (FIG. 1B) removes the sacrificial gate structure 224 to form a gate trench 264, as shown in FIGS. 20A and 20B. The gate trench 264 exposes the epitaxial layers 214 and 216 in the channel region. The ILD layer 262 (and the CESL layer) protects the epitaxial S/D features 254 during the removal of the sacrificial gate structure 224. The sacrificial gate structure 224 can be removed using plasma dry etching and/or wet etching. When the sacrificial gate electrode layer is polysilicon and the ILD layer 262 is silicon oxide, a wet etchant such as a TMAH solution can be used to selectively remove the sacrificial gate electrode layer. The sacrificial gate dielectric layer is thereafter removed using plasma dry etching and/or wet etching.

Figure 21B:
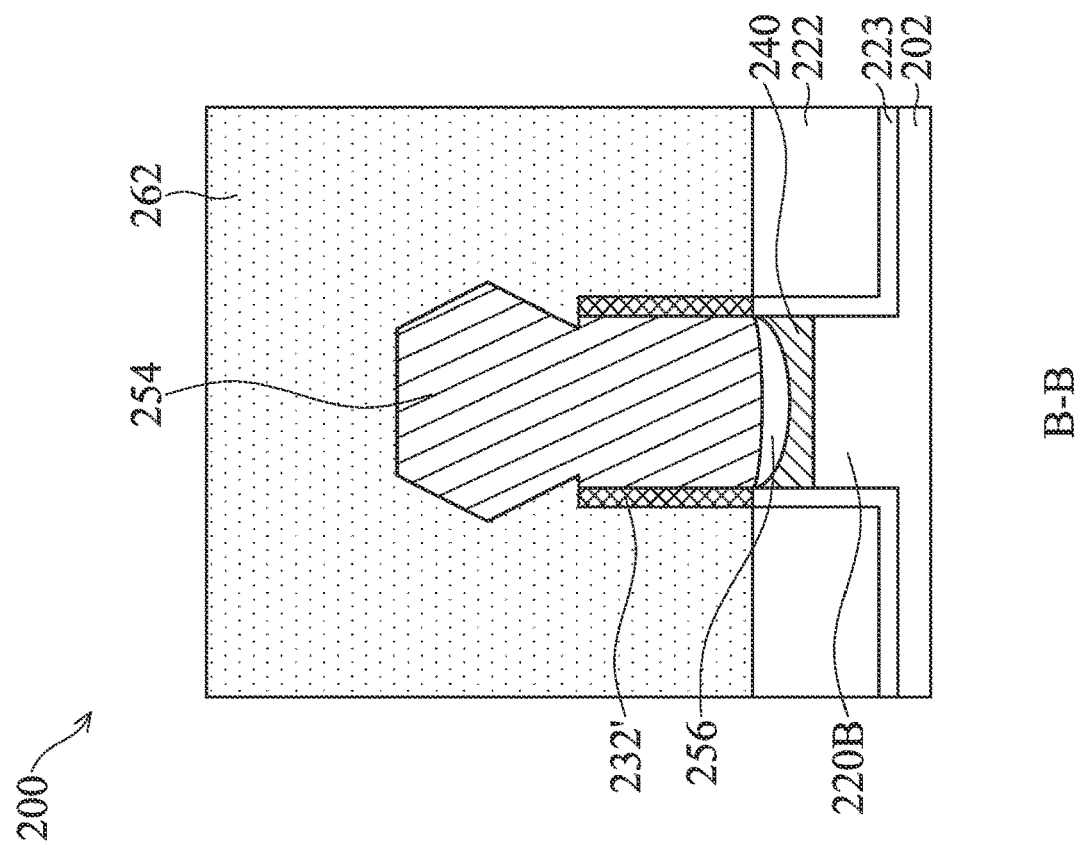
Figure 21A:
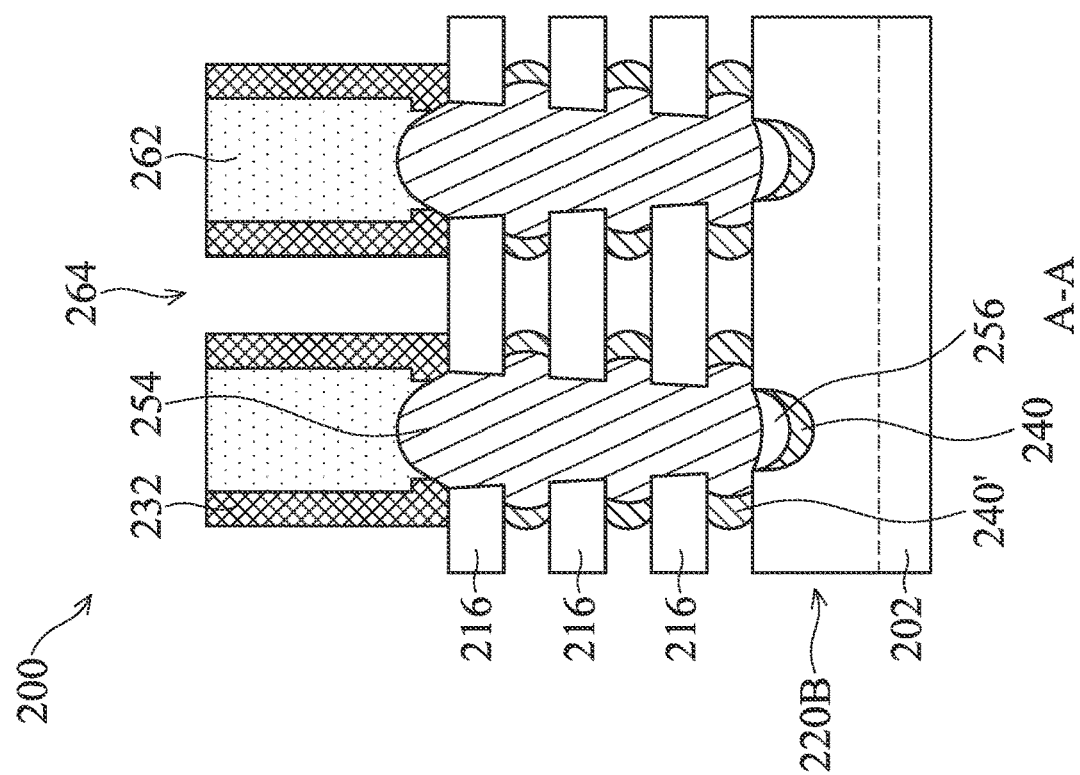

At operation 136, the method 100 (FIG. 1B) releases channel structures from the channel region of the GAA device, as shown in FIGS. 21A and 21B. In the illustrated embodiment, channel structures are the epitaxial layers 216 in the form of nanosheets. In the present embodiment, the epitaxial layers 216 include silicon, and the epitaxial layers 214 include silicon germanium. The plurality of epitaxial layers 214 may be selectively removed. In some implementations, the selectively removal process includes oxidizing the plurality of epitaxial layers 214 using a suitable oxidizer, such as ozone. Thereafter, the oxidized epitaxial layers 214 may be selectively removed from the gate trench 264. To further this embodiment, the operation 136 includes a dry etching process to selectively remove the epitaxial layers 214, for example, by applying an HCl gas at a temperature of about 500° C. to about 700° C., or applying a gas mixture of $CF_4$, $SF_6$, and $CHF_3$. For the sake of simplicity and clarity, after operation 136, the epitaxial layers 216 are denoted as channel structures 216. At this point, vertically stacked channel structures 216 are formed in the channel regions of the n-type GAA device in the NFET region 204 and the p-type GAA device in the PFET region 206.

Figure 22B:
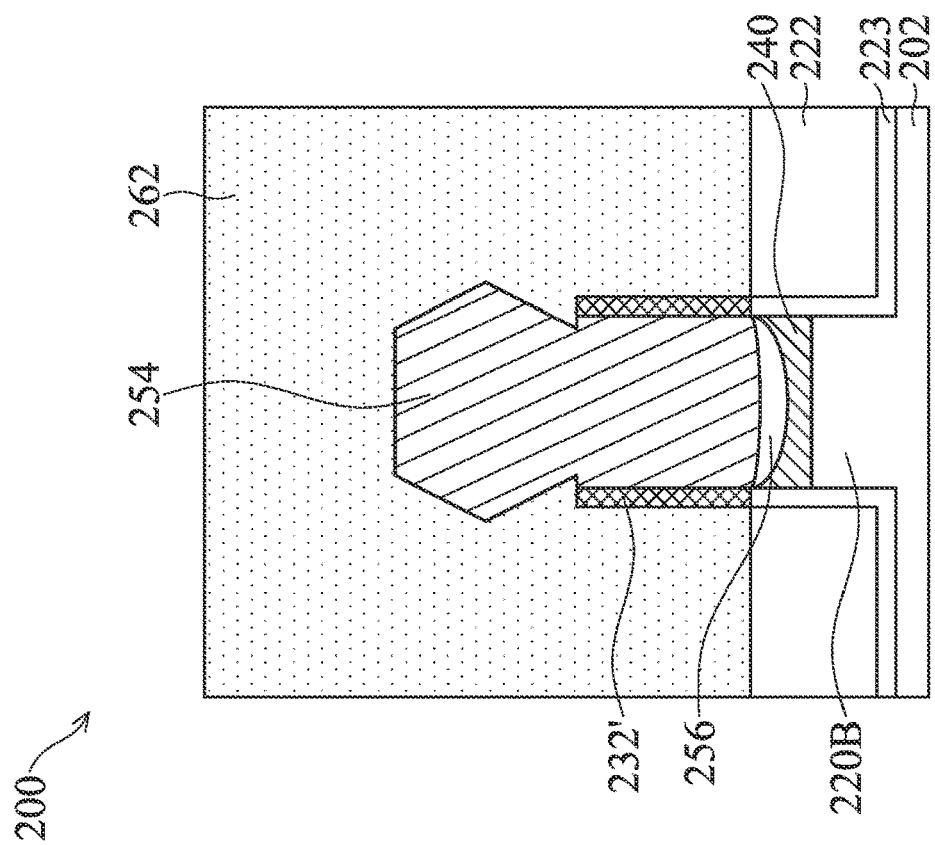
Figure 22A:
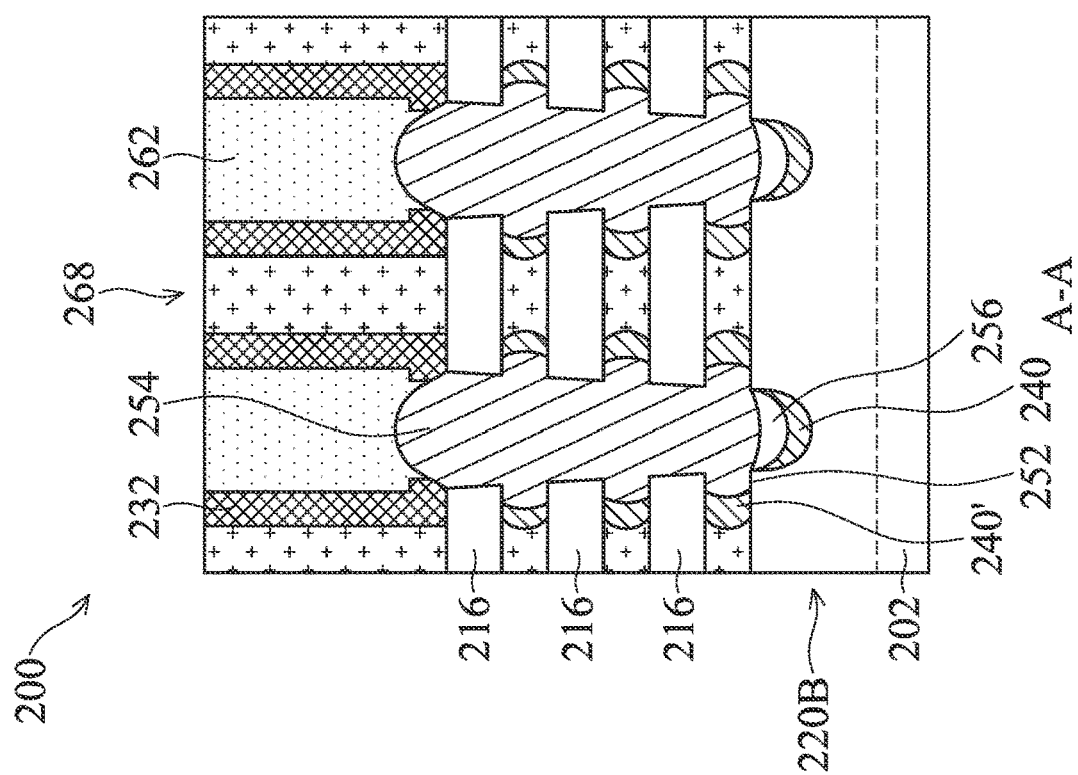

At operation 138, the method 100 (FIG. 1B) forms a metal gate structure 268 in the gate trench 264 wrapping each of the channel structures 216 in the channel region, as shown in FIGS. 22A and 22B. The metal gate structure 268 also engages the top surface of the fin-shape base 220B. The inner spacers 240' separate the metal gate structure 268 from contacting the epitaxial S/D features 254. The insulating dielectric layer 240 and the air gap 256 separate the epitaxial S/D features 254 from most portions of the top surface of the fin-shape base 220B (or substrate 202). Even there may still be a contact area due to a small portion of the exposed top surface 252, this contact area is quite small and the leakage current under the stacked channel structures is still significantly limited when the metal gate structure 268 applies a gate drive voltage to the top surface of the fin-shape base 220B.

The metal gate structure 268 includes a gate dielectric layer wrapping each channel structures 216 in the channel region and a gate electrode layer formed on the gate dielectric layer. In some embodiments, the gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. In some embodiments, the gate dielectric layer includes an interfacial layer formed between the channel strucutres and the dielectric material. The gate dielectric layer may be formed by CVD, ALD or any suitable method. In one embodiment, the gate dielectric layer is formed using a highly conformal deposition process such as ALD in order to ensure the formation of a gate dielectric layer having a uniform thickness around each channel layers. The gate electrode layer is formed on the gate dielectric layer to surround each channel structure. The gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer may be formed by CVD, ALD, electro-plating, or other suitable method. In certain embodiments of the present disclosure, one or more work function adjustment layers are interposed between the gate dielectric layer and the gate electrode layer. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 23B:
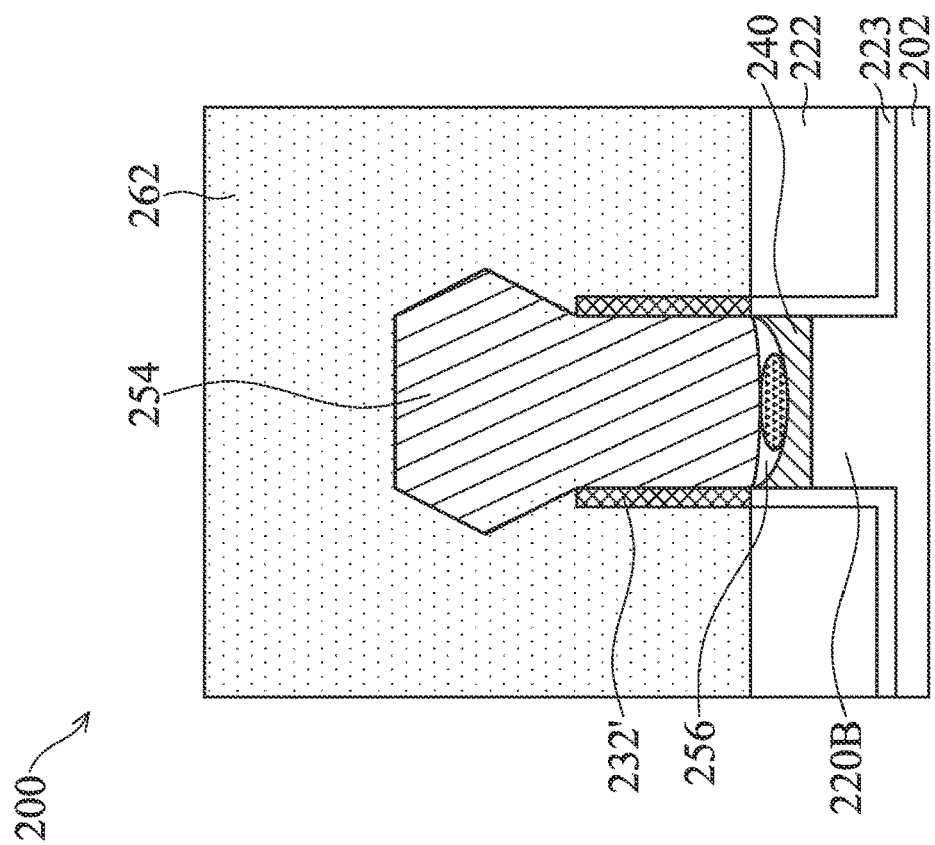
Figure 23A:
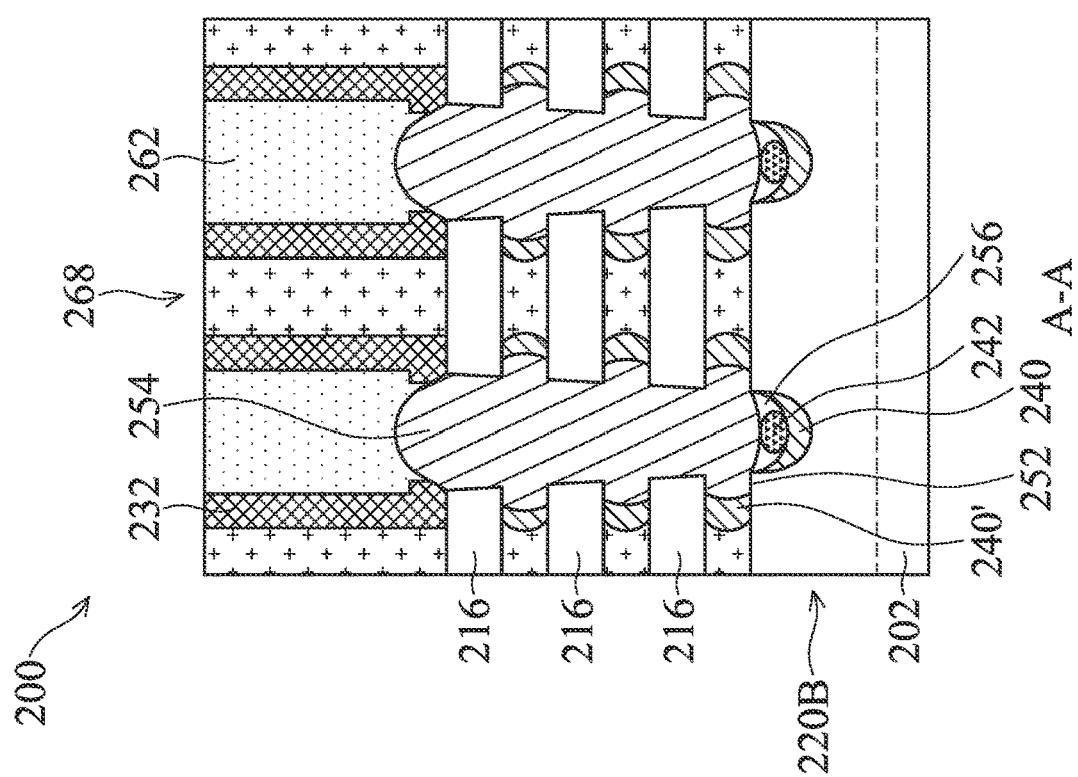

Reference is now made to FIGS. 23A and 23B. FIGS. 23A and 23B show an alternative embodiment of the resultant structure after operation 138. Some processes and materials used to form the semiconductor device 200 may be similar to or the same as what has been described previously in association with FIGS. 1A-22B, and are not repeated herein. One difference is that operation 126 in removing the etch protection layer 242 is skipped, such that at least a portion of the etch protection layer 242 (e.g., after some etch loss due to limited etching contrast) over the insulating dielectric layer 240 still remains. In the illustrated embodiment, the bottom surface of the epitaxial S/D feature 254 lands on the small exposed top surface 252 of the fin-shape base 220B and the etch protection layer 242. Further, the air gap 256 may be divided by the abutting etch protection layer 242 and the insulating dielectric layer 240 into a left portion and a right portion, in accordance with some embodiments.

Figure 24B:
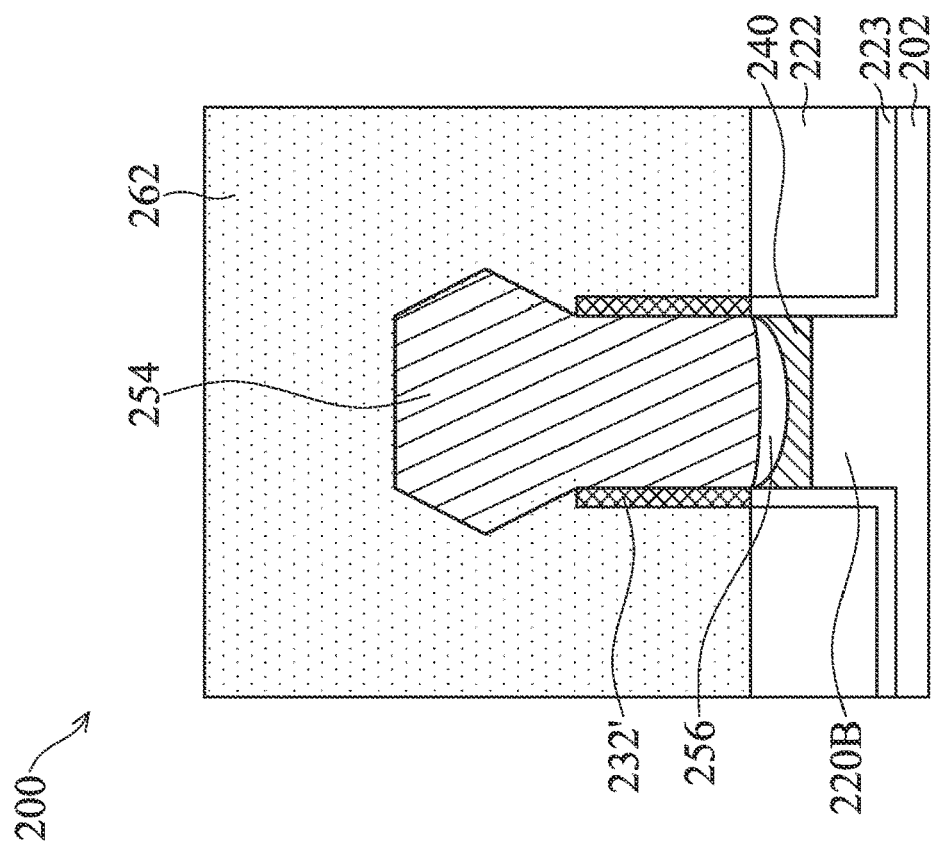
Figure 24A:
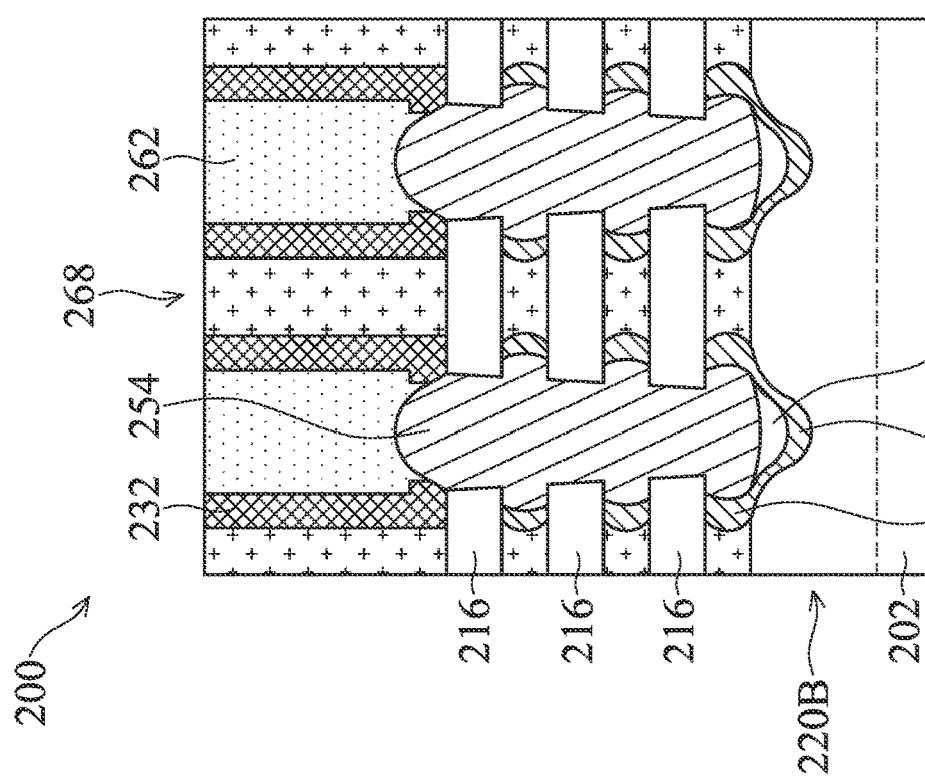

Reference is now made to FIGS. 24A and 24B. FIGS. 24A and 24B show another alternative embodiment of the resultant structure after operation 138. Some processes and materials used to form the semiconductor device 200 may be similar to or the same as what has been described previously in association with FIGS. 1A-22B, and are not repeated herein. One difference is that insulating dielectric material extends continuously from the bottommost inner spacer 240' to the bottom portion of the insulating dielectric layer 240 such that the top surface of the fin-shape base 220B is fully covered. The epitaxial S/D feature 254 is not in physical contact with the fin-shape base 220B and lands on the insulating dielectric layer 240.

Figure 25B:
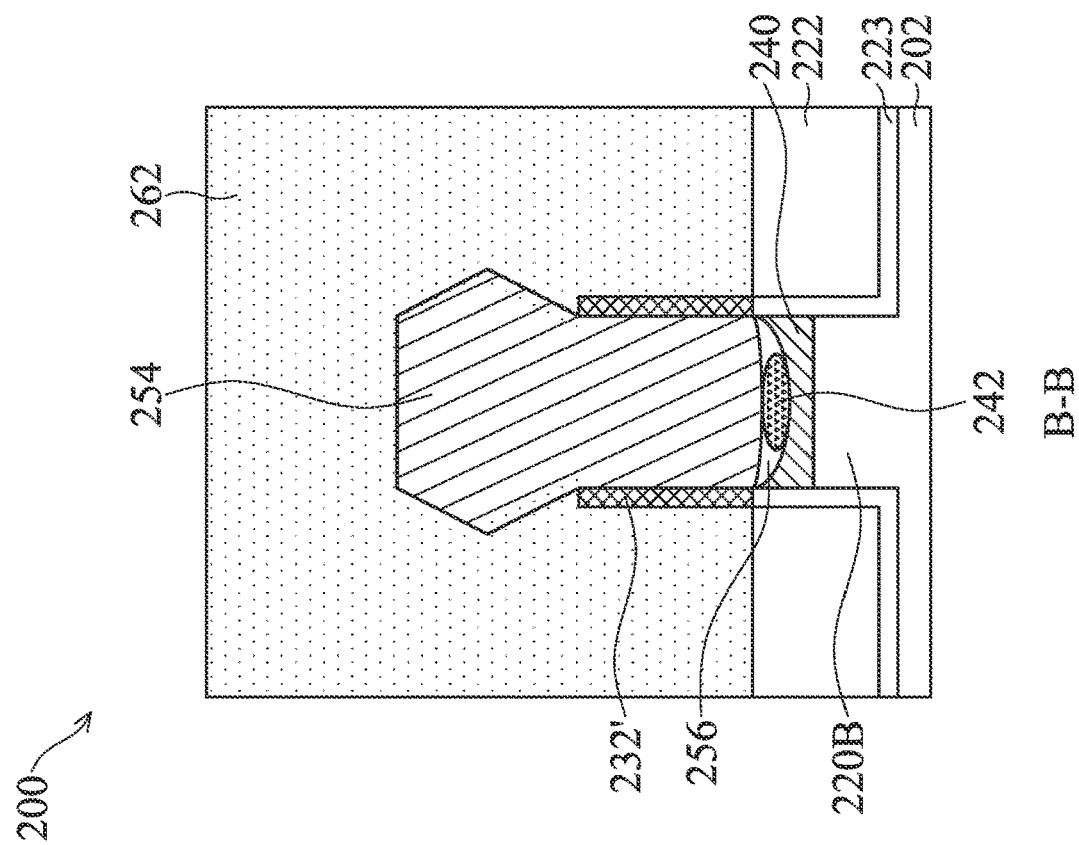
Figure 25A:
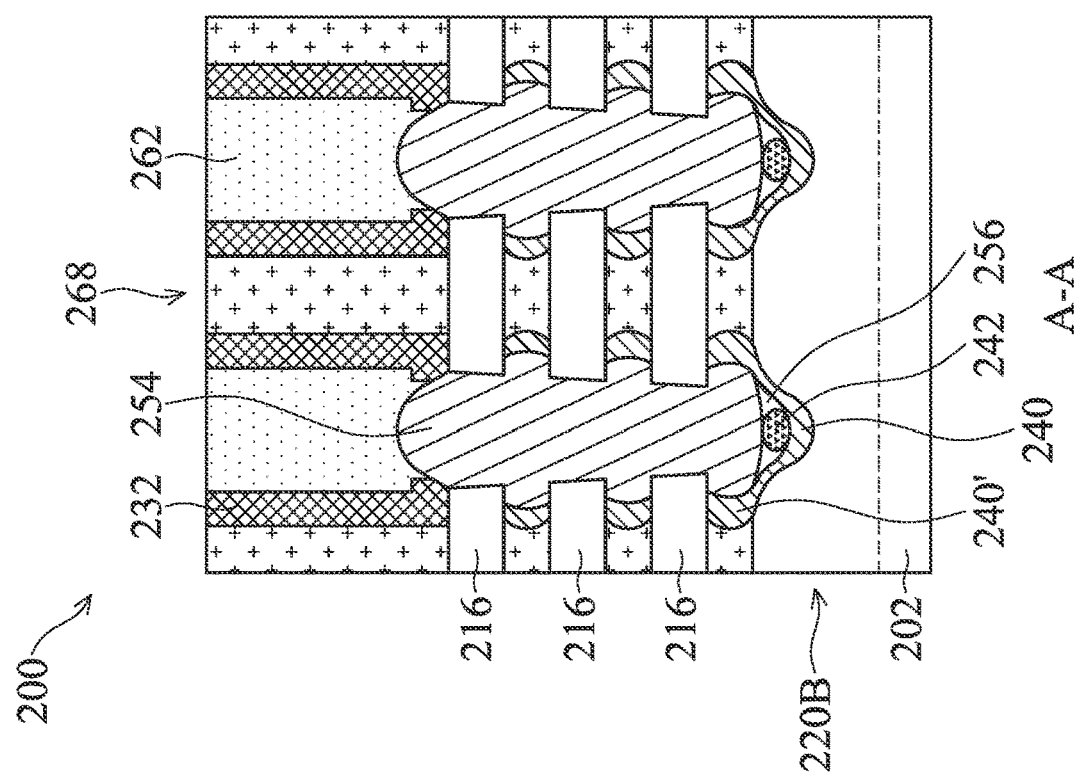

Reference is now made to FIGS. 25A and 25B. FIGS. 25A and 25B show yet another alternative embodiment of the resultant structure after operation 138. Some processes and materials used to form the semiconductor device 200 may be similar to or the same as what has been described previously in association with FIGS. 1A-22B, and are not repeated herein. One difference is that insulating dielectric material extends continuously from the bottommost inner spacer 240' to the bottom portion of the insulating dielectric layer 240 such that the top surface of the fin-shape base 220B is fully covered. Further, operation 126 in removing the etch protection layer 242 is skipped, such that at least a portion of the etch protection layer 242 (after some etching loss due to limited etching contrast) over the insulating dielectric layer 240 still remains. In the illustrated embodiment, the bottom surface of the epitaxial S/D feature 254 lands on the insulating dielectric layer 240 and the etch protection layer 242 and is not in physical contact with the fin-shape base 220B. Further, the air gap 256 may be divided by the abutting etch protection layer 242 and the insulating dielectric layer 240 into a left portion and a right portion, in accordance with some embodiments.

Although not intended to be limiting, one or more embodiments of the present disclosure provide many benefits to a semiconductor device and the formation thereof. The present disclosure provides methods of forming a GAA device with an insulating dielectric layer under the epitaxial S/D features. The insulating dielectric layer provides isolation between the epitaxial S/D features and the semiconductor substrate underneath the stacked channel structures. Accordingly, this provides a benefit of substrate leakage current suppression. Furthermore, the GAA flow with insulating dielectric layer formation method can be easily integrated into existing semiconductor fabrication processes.

In one exemplary aspect, the present disclosure is directed to a method of manufacturing a semiconductor device. The method includes forming a fin structure over a substrate, wherein the fin structure includes first semiconductor layers and second semiconductor layers alternately stacked; forming a sacrificial gate structure over the fin structure; etching a source/drain (S/D) region of the fin structure, which is not covered by the sacrificial gate structure, thereby forming an S/D recess; depositing an insulating dielectric layer in the S/D recess; depositing an etch protection layer over a bottom portion of the insulating dielectric layer; partially removing the insulating dielectric layer, such that the bottom portion of the insulating dielectric layer remains in the S/D recess; and growing an epitaxial S/D feature in the S/D recess, wherein the bottom portion of the insulating dielectric layer interposes the epitaxial S/D feature and the substrate. In some embodiments, the depositing of the etch protection layer includes: depositing the etch protection layer in the S/D recess covering the insulating dielectric layer, and recessing the etch protection layer, thereby exposing an upper portion of the insulating dielectric layer. In some embodiments, the method further includes laterally recessing the first semiconductor layers through the S/D recess, thereby forming cavities, wherein the depositing of the insulating dielectric layer includes depositing the insulating dielectric layer in the cavities and on the lateral ends of the second semiconductor layers. In some embodiments, the partially removing of the insulating dielectric layer removes the insulating dielectric layer from the lateral ends of the second semiconductor layers, while the insulating dielectric layer in the cavities remains, thereby forming inner spacers interposing the epitaxial S/D feature and the first semiconductor layers. In some embodiments, after the partially removing of the insulating dielectric layer, a top surface of the substrate is exposed. In some embodiments, after the growing of the epitaxial S/D feature, the epitaxial S/D feature is in physical contact with the top surface of the substrate. In some embodiments, after the etching of the S/D region, a top surface of the substrate is exposed in the S/D recess, and wherein after the partially removing of the insulating dielectric layer, the top surface of the substrate remains fully covered by the bottom portion of the insulating dielectric layer. In some embodiments, the method further includes prior to the growing of the epitaxial S/D feature, removing the etch protect layer from the S/D recess. In some embodiments, after the growing of the epitaxial S/D feature, the etch protect layer and the bottom portion of the insulating dielectric layer interpose the epitaxial S/D feature and the substrate. In some embodiments, the growing of the epitaxial S/D feature traps an air gap under a bottom surface of the epitaxial S/D feature.

In another exemplary aspect, the present disclosure is directed to a method of manufacturing a semiconductor device. The method includes forming a fin, the fin having an epitaxial portion and a base portion protruding from a substrate, the epitaxial portion having a plurality of sacrificial layers and a plurality of channel layers, the sacrificial layers and the channel layers being alternately arranged; removing the sacrificial layers and the channel layers from a source/drain (S/D) region of the fin, thereby forming an S/D trench exposing a top surface of the base portion; depositing a first dielectric layer in the S/D trench, the first dielectric layer covering lateral ends of the sacrificial and channel layers and the top surface of the base portion; depositing a second dielectric layer in the S/D trench, the second dielectric layer covering a bottom portion of the first dielectric layer; partially removing a top portion of the first dielectric layer to expose the lateral ends of the channel layers in the S/D trench; epitaxially growing an S/D feature in the S/D trench, the bottom portion of the first dielectric layer interposing a bottom surface of the S/D feature and the top surface of the base portion; removing the sacrificial layers from a channel region of the fin, thereby forming a gate trench; and forming a gate structure wrapping each of the channel layers in the gate trench. In some embodiments, the partially removing of the top portion of the first dielectric layer also exposes a portion of the top surface of the base portion. In some embodiments, the epitaxially growing of the S/D feature takes place on the lateral ends of the channel layers and the portion of the top surface of the base portion. In some embodiments, the epitaxially growing of the S/D feature encloses an air gap between the bottom surface of the S/D feature and the bottom portion of the first dielectric layer. In some embodiments, the air gap is divided into two portions by the first and second dielectric layers. In some embodiments, the method further includes prior to the epitaxially growing of the S/D feature, removing the second dielectric layer from the S/D trench.

In another exemplary aspect, the present disclosure is directed to a multi-gate semiconductor device. The multi-gate semiconductor device includes channel structures disposed over a substrate; a gate structure engaging the channel structures; a source/drain (S/D) epitaxial feature abutting the channel structures; inner spacers interposing the gate structure and the S/D epitaxial feature; and a dielectric layer interposing a bottom surface of the S/D epitaxial feature and a top surface of the substrate. In some embodiments, the multi-gate semiconductor device further includes an air gap interposing the bottom surface of the S/D epitaxial feature and a top surface of the dielectric layer. In some embodiments, the multi-gate semiconductor device further includes an etch protection layer interposing the bottom surface of the S/D epitaxial feature and a top surface of the dielectric layer. In some embodiments, the dielectric layer is in physical contact with a bottommost one of the inner spacers.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a semiconductor device, comprising:
forming a fin structure over a substrate, wherein the fin structure includes first semiconductor layers and second semiconductor layers alternately stacked;
depositing an isolation feature on sidewalls of the fin structure;
forming a sacrificial gate structure over the fin structure;
etching a source/drain (S/D) region of the fin structure, which is not covered by the sacrificial gate structure, thereby forming an S/D recess;
depositing an insulating dielectric layer in the S/D recess;
depositing an etch protection layer over a bottom portion of the insulating dielectric layer, wherein a top surface of the etch protection layer is above a top surface of the isolation feature and below a bottom surface of a bottommost one of the second semiconductor layers;
partially removing the insulating dielectric layer, such that the bottom portion of the insulating dielectric layer remains in the S/D recess; and
growing an epitaxial S/D feature in the S/D recess, wherein the bottom portion of the insulating dielectric layer interposes the epitaxial S/D feature and the substrate.

2. The method of claim 1, wherein the depositing of the etch protection layer includes:
depositing the etch protection layer in the S/D recess covering the insulating dielectric layer, and
prior to the partially removing of the insulating dielectric layer, etching back the etch protection layer, thereby exposing an upper portion of the insulating dielectric layer.

3. The method of claim 1, further comprising:
laterally recessing the first semiconductor layers through the S/D recess, thereby forming cavities,
wherein the depositing of the insulating dielectric layer includes depositing the insulating dielectric layer in the cavities and on the lateral ends of the second semiconductor layers.

4. The method of claim 3, wherein the partially removing of the insulating dielectric layer removes the insulating dielectric layer from the lateral ends of the second semiconductor layers, while the insulating dielectric layer in the cavities remains, thereby forming inner spacers interposing the epitaxial S/D feature and the first semiconductor layers.

5. The method of claim 1, wherein after the partially removing of the insulating dielectric layer, a top surface of the substrate is exposed.

6. The method of claim 5, wherein after the growing of the epitaxial S/D feature, the epitaxial S/D feature is in physical contact with the top surface of the substrate.

7. The method of claim 1, wherein after the etching of the S/D region, a top surface of the substrate is exposed in the S/D recess, and wherein after the partially removing of the insulating dielectric layer, the top surface of the substrate remains fully covered by the bottom portion of the insulating dielectric layer.

8. The method of claim 1, further comprising:
prior to the growing of the epitaxial S/D feature, removing the etch protect layer from the S/D recess.

9. The method of claim 1, wherein after the growing of the epitaxial S/D feature, the etch protect layer and the bottom portion of the insulating dielectric layer interpose the epitaxial S/D feature and the substrate.

10. The method of claim 1, wherein the growing of the epitaxial S/D feature traps an air gap under a bottom surface of the epitaxial S/D feature.

11. A method of manufacturing a semiconductor device, comprising:
forming a fin, the fin having an epitaxial portion and a base portion protruding from a substrate, the epitaxial portion having a plurality of sacrificial layers and a plurality of channel layers, the sacrificial layers and the channel layers being alternately arranged;
removing the sacrificial layers and the channel layers from a source/drain (S/D) region of the fin, thereby forming an S/D trench exposing a top surface of the base portion;
depositing a first dielectric layer in the S/D trench, the first dielectric layer covering lateral ends of the sacrificial and channel layers and the top surface of the base portion;
depositing a second dielectric layer in the S/D trench, the second dielectric layer covering a bottom portion of the first dielectric layer;
partially removing a top portion of the first dielectric layer to expose the lateral ends of the channel layers in the S/D trench, wherein remaining portions of the top portion of the first dielectric layer form inner spacers disposed on the lateral ends of the sacrificial layers, wherein the bottom portion of the first dielectric layer is disconnected from a bottommost one of the inner spacers, and wherein the partially removing of the top portion of the first dielectric layer also exposes a portion of the top surface of the base portion;
epitaxially growing an S/D feature in the S/D trench, the bottom portion of the first dielectric layer interposing and in physical contact with a bottom surface of the S/D feature and the top surface of the base portion;
removing the sacrificial layers from a channel region of the fin, thereby forming a gate trench; and
forming a gate structure wrapping each of the channel layers in the gate trench.

12. The method of claim 11, wherein the epitaxially growing of the S/D feature takes place on the lateral ends of the channel layers and the portion of the top surface of the base portion.

13. The method of claim 11, wherein the epitaxially growing of the S/D feature encloses an air gap between the bottom surface of the S/D feature and the bottom portion of the first dielectric layer.

14. The method of claim 13, wherein the air gap is divided into two portions by the first and second dielectric layers.

15. The method of claim 11, further comprising:
prior to the epitaxially growing of the S/D feature, removing the second dielectric layer from the S/D trench.

16. A method of manufacturing a semiconductor device, comprising:
forming a first fin structure having an epitaxial stack over a first region of a substrate and a second fin structure having an epitaxial stack over a second region of the substrate, the second region having a different doping configuration from the first region, the epitaxial stacks of the first and second fin structures each including sacrificial layers and channel layers alternately stacked;
depositing an isolation feature on sidewalls of the first fin structure and the second fin structure;

forming a sacrificial gate structure over the first and second fin structures thereby defining source/drain (S/D) regions disposed on opposing sides of the sacrificial gate structure;

etching portions of the first and second fin structures to form S/D trenches in the S/D regions;

forming a first mask layer with openings exposing the S/D trenches over the first region while the second region is covered;

laterally etching end portions of the sacrificial layers of the first fin structure, thereby forming cavities over the first region;

depositing a first dielectric layer in the S/D trenches over the first region;

depositing a second dielectric layer in the S/D trenches over the first region and over a bottom portion of the first dielectric layer, wherein a top surface of the second dielectric layer is above a top surface of the isolation feature and below a bottom surface of a bottommost one of the channel layers in the first fin structure;

partially recessing the first dielectric layer from the S/D trenches over the first region so as the first dielectric layer substantially remains within the cavities over the first region;

growing first epitaxial S/D features in the S/D trenches over the first region, wherein a bottom portion of the second dielectric layer interposes the first epitaxial S/D features and the first region of the substrate;

removing the first mask layer;

forming a second mask layer with openings exposing the S/D trenches over the second region while the first region is covered;

laterally etching end portions of the sacrificial layers of the second fin structure, thereby forming cavities over the second region;

depositing a third dielectric layer in the S/D trenches over the second region;

depositing a fourth dielectric layer in the S/D trenches over the second region and over a bottom portion of the third dielectric layer, wherein a top surface of the fourth dielectric layer is above a top surface of the isolation feature and below a bottom surface of a bottommost one of the channel layer in the second fin structure;

partially recessing the third dielectric layer from the S/D recesses over the second region so as the third dielectric layer substantially remains within the cavities over the second region; and growing second epitaxial S/D features in the S/D recesses over the second region, wherein a bottom portion of the fourth dielectric layer interposes the second epitaxial S/D features and the second region of the substrate.

17. The method of claim 16, further comprising:
forming a liner layer blanket deposited over the first and second fin structures;
depositing a dielectric material filling a trench between the first and second fin structures; and
recessing the dielectric material and the liner layer, thereby forming an isolation feature.

18. The method of claim 17, wherein a top surface of the isolation feature is coplanar with a bottom surface of the epitaxial stacks.

19. The method of claim 16, wherein the growing of the first and second epitaxial S/D features traps air gaps under bottom surfaces of the first and second epitaxial S/D features.

20. The method of claim 1, further comprising:
after the growing of the epitaxial S/D feature, removing the sacrificial gate structure to form a gate trench;
removing the first semiconductor layers from the gate trench to release the second semiconductor layers; and
forming a metal gate structure in the gate trench, wherein the metal gate structure wraps around each of the second semiconductor layers.

* * * * *